(12) United States Patent
Bjorstrom

(10) Patent No.: US 9,558,771 B2
(45) Date of Patent: *Jan. 31, 2017

(54) PIEZOELECTRIC DISK DRIVE SUSPENSION MOTORS HAVING PLATED STIFFENERS

(71) Applicant: Hutchinson Technology Incorporated, Hutchinson, MN (US)

(72) Inventor: Jacob D. Bjorstrom, Hutchinson, MN (US)

(73) Assignee: Hutchinson Technology Incorporated, Hutchinson, MN (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/719,521

(22) Filed: May 22, 2015

(65) Prior Publication Data
US 2016/0171995 A1 Jun. 16, 2016

Related U.S. Application Data

(63) Continuation of application No. 14/572,263, filed on Dec. 16, 2014.

(51) Int. Cl.
*G11B 5/48* (2006.01)
*G11B 5/55* (2006.01)

(52) U.S. Cl.
CPC ............ *G11B 5/4873* (2013.01); *G11B 5/483* (2015.09); *G11B 5/4833* (2013.01); *G11B 5/4853* (2013.01); *G11B 5/5552* (2013.01)

(58) Field of Classification Search
CPC ... G11B 5/5552; G11B 5/4826; G11B 5/4873; G11B 5/4853; G11B 5/596
See application file for complete search history.

(56) References Cited

U.S. PATENT DOCUMENTS

| | | | |
|---|---|---|---|
| 3,320,556 | A | 5/1967 | Schneider |
| 3,582,575 | A | 6/1971 | Scofield |
| 3,862,522 | A | 1/1975 | Mednick |
| 3,877,120 | A | 4/1975 | Hikota et al. |
| 3,910,339 | A | 10/1975 | Kramer |
| 4,014,257 | A | 3/1977 | Bettenhausen |

(Continued)

FOREIGN PATENT DOCUMENTS

| | | |
|---|---|---|
| EP | 0591954 B1 | 4/1994 |
| EP | 0834867 B1 | 5/2007 |

(Continued)

OTHER PUBLICATIONS

U.S. Appl. No. 14/579,063, filed Dec. 22, 2014.

(Continued)

*Primary Examiner* — Brian Miller

(57) ABSTRACT

Various embodiments concern a gimbaled flexure having a dual stage actuation structure. The flexure comprises a gimbal on which a motor is mounted. The motor comprises a first terminal, one or more layers of piezoelectric material, and a metal stiffener disposed directly on the first terminal. The stiffener comprises a layer of metal defining a majority of a top side of the motor. The first terminal can be gold sputtered on the piezoelectric material while the stiffener can be nickel plated on the gold. The stiffener can cause the motor, and the flexure on which it is mounted, to curl upon electrical activation of the motor.

20 Claims, 12 Drawing Sheets

(56) References Cited

U.S. PATENT DOCUMENTS

| | | | |
|---|---|---|---|
| 4,168,214 A | 9/1979 | Fletcher et al. | |
| 4,181,554 A | 1/1980 | Rich | |
| 4,299,130 A | 11/1981 | Koneval | |
| 4,418,239 A | 11/1983 | Larson et al. | |
| 4,422,906 A | 12/1983 | Kobayashi | |
| 4,659,438 A | 4/1987 | Kuhn et al. | |
| 4,670,804 A * | 6/1987 | Kant | G11B 5/54 360/230 |
| 4,916,798 A | 4/1990 | Ballast | |
| 5,140,288 A | 8/1992 | Grunwell | |
| 5,189,779 A | 3/1993 | Fishel et al. | |
| 5,212,847 A | 5/1993 | Melcher et al. | |
| 5,275,076 A | 1/1994 | Greenwalt | |
| 5,320,272 A | 6/1994 | Melton et al. | |
| 5,321,568 A | 6/1994 | Hatam-Tabrizi | |
| 5,333,085 A | 7/1994 | Prentice et al. | |
| 5,427,848 A | 6/1995 | Baer et al. | |
| 5,459,921 A | 10/1995 | Hudson et al. | |
| 5,485,053 A | 1/1996 | Baz | |
| 5,491,597 A | 2/1996 | Bennin et al. | |
| 5,521,778 A | 5/1996 | Boutaghou et al. | |
| 5,526,208 A | 6/1996 | Hatch et al. | |
| 5,598,307 A | 1/1997 | Bennin | |
| 5,608,590 A | 3/1997 | Ziegler et al. | |
| 5,608,591 A | 3/1997 | Klaassen | |
| 5,631,786 A | 5/1997 | Erpelding | |
| 5,636,089 A | 6/1997 | Jurgenson et al. | |
| 5,651,723 A | 7/1997 | Bjornard et al. | |
| 5,657,186 A | 8/1997 | Kudo et al. | |
| 5,657,188 A | 8/1997 | Jurgenson et al. | |
| 5,666,241 A | 9/1997 | Summers | |
| 5,666,717 A | 9/1997 | Matsumoto et al. | |
| 5,694,270 A | 12/1997 | Sone et al. | |
| 5,712,749 A | 1/1998 | Gustafson | |
| 5,714,444 A | 2/1998 | Yokouchi et al. | |
| 5,717,547 A | 2/1998 | Young | |
| 5,722,142 A | 3/1998 | Myers | |
| 5,734,526 A * | 3/1998 | Symons | G11B 5/4826 360/244.3 |
| 5,737,152 A | 4/1998 | Balakrishnan | |
| 5,754,368 A | 5/1998 | Shiraishi et al. | |
| 5,764,444 A | 6/1998 | Imamura et al. | |
| 5,773,889 A | 6/1998 | Love et al. | |
| 5,790,347 A | 8/1998 | Girard | |
| 5,795,435 A | 8/1998 | Waters et al. | |
| 5,796,552 A | 8/1998 | Akin, Jr. et al. | |
| 5,805,382 A | 9/1998 | Lee et al. | |
| 5,812,344 A | 9/1998 | Balakrishnan | |
| 5,818,662 A | 10/1998 | Shum | |
| 5,857,257 A | 1/1999 | Inaba | |
| 5,862,010 A | 1/1999 | Simmons et al. | |
| 5,862,015 A | 1/1999 | Evans et al. | |
| 5,889,137 A | 3/1999 | Hutchings et al. | |
| 5,892,637 A | 4/1999 | Brooks, Jr. et al. | |
| 5,893,201 A | 4/1999 | Myers | |
| 5,898,541 A | 4/1999 | Boutaghou et al. | |
| 5,898,544 A | 4/1999 | Krinke et al. | |
| 5,914,834 A | 6/1999 | Gustafson | |
| 5,921,131 A | 7/1999 | Stange | |
| 5,922,000 A | 7/1999 | Chodorow | |
| 5,924,187 A | 7/1999 | Matz | |
| 5,929,390 A | 7/1999 | Naito et al. | |
| 5,956,212 A | 9/1999 | Zhu | |
| 5,973,882 A | 10/1999 | Tangren | |
| 5,973,884 A | 10/1999 | Hagen | |
| 5,986,853 A | 11/1999 | Simmons et al. | |
| 5,995,328 A | 11/1999 | Balakrishnan | |
| 5,995,329 A | 11/1999 | Shiraishi et al. | |
| 6,011,671 A | 1/2000 | Masse et al. | |
| 6,014,289 A * | 1/2000 | Goss | G11B 5/4813 360/244.1 |
| 6,029,334 A | 2/2000 | Hartley | |
| 6,038,102 A | 3/2000 | Balakrishnan et al. | |
| 6,046,887 A | 4/2000 | Uozumi et al. | |
| 6,055,132 A | 4/2000 | Arya et al. | |
| 6,063,228 A | 5/2000 | Sasaki et al. | |
| 6,075,676 A | 6/2000 | Hiraoka et al. | |
| 6,078,470 A | 6/2000 | Danielson et al. | |
| 6,085,456 A | 7/2000 | Battaglia | |
| 6,095,023 A | 8/2000 | Harada et al. | |
| 6,108,175 A * | 8/2000 | Hawwa | G11B 5/4813 360/294.4 |
| 6,115,221 A | 9/2000 | Utsunomiya | |
| 6,118,637 A | 9/2000 | Wright et al. | |
| 6,144,531 A | 11/2000 | Sawai | |
| 6,146,813 A | 11/2000 | Girard et al. | |
| 6,156,982 A | 12/2000 | Dawson | |
| 6,157,522 A | 12/2000 | Murphy et al. | |
| 6,172,853 B1 | 1/2001 | Davis et al. | |
| 6,181,520 B1 | 1/2001 | Fukuda | |
| 6,195,227 B1 | 2/2001 | Fan et al. | |
| 6,215,622 B1 | 4/2001 | Ruiz et al. | |
| 6,215,629 B1 | 4/2001 | Kant et al. | |
| 6,229,673 B1 | 5/2001 | Shinohara et al. | |
| 6,233,124 B1 | 5/2001 | Budde et al. | |
| 6,239,953 B1 | 5/2001 | Mei | |
| 6,246,546 B1 | 6/2001 | Tangren | |
| 6,246,552 B1 * | 6/2001 | Soeno | G11B 5/5552 360/294.4 |
| 6,249,404 B1 | 6/2001 | Doundakov et al. | |
| 6,262,868 B1 | 7/2001 | Arya et al. | |
| 6,275,358 B1 | 8/2001 | Balakrishnan et al. | |
| 6,278,587 B1 | 8/2001 | Mei | |
| 6,282,062 B1 | 8/2001 | Shiraishi | |
| 6,289,564 B1 | 9/2001 | Novotny | |
| 6,295,185 B1 | 9/2001 | Stefansky | |
| 6,297,936 B1 * | 10/2001 | Kant | G11B 5/5552 360/294.4 |
| 6,300,846 B1 | 10/2001 | Brunker | |
| 6,307,715 B1 | 10/2001 | Berding et al. | |
| 6,308,483 B1 | 10/2001 | Romine | |
| 6,320,730 B1 * | 11/2001 | Stefansky | G11B 5/5552 360/294.4 |
| 6,330,132 B1 | 12/2001 | Honda | |
| 6,349,017 B1 | 2/2002 | Schott | |
| 6,366,431 B1 | 4/2002 | Tsuchiya et al. | |
| 6,376,964 B1 | 4/2002 | Young et al. | |
| 6,380,483 B1 | 4/2002 | Blake | |
| 6,381,821 B1 | 5/2002 | Panyon | |
| 6,387,111 B1 | 5/2002 | Barber | |
| 6,396,667 B1 * | 5/2002 | Zhang | G11B 5/5552 360/294.3 |
| 6,399,899 B1 | 6/2002 | Ohkawa et al. | |
| 6,400,532 B1 | 6/2002 | Mei | |
| 6,404,594 B1 | 6/2002 | Maruyama et al. | |
| 6,407,481 B1 | 6/2002 | Takeuchi et al. | |
| 6,424,500 B1 | 7/2002 | Coon et al. | |
| 6,445,546 B1 | 9/2002 | Coon | |
| 6,459,549 B1 | 10/2002 | Tsuchiya et al. | |
| 6,480,359 B1 | 11/2002 | Dunn et al. | |
| 6,487,045 B1 | 11/2002 | Yanagisawa | |
| 6,490,228 B2 | 12/2002 | Killam | |
| 6,493,190 B1 | 12/2002 | Coon | |
| 6,493,192 B2 * | 12/2002 | Crane | G11B 5/5552 360/294.3 |
| 6,498,704 B1 | 12/2002 | Chessman et al. | |
| 6,501,625 B1 | 12/2002 | Boismier et al. | |
| 6,539,609 B2 | 4/2003 | Palmer et al. | |
| 6,549,376 B1 | 4/2003 | Scura et al. | |
| 6,549,736 B2 | 4/2003 | Miyabe et al. | |
| 6,563,676 B1 | 5/2003 | Chew et al. | |
| 6,581,262 B1 | 6/2003 | Myers | |
| 6,596,184 B1 | 7/2003 | Shum et al. | |
| 6,597,541 B2 | 7/2003 | Nishida et al. | |
| 6,600,631 B1 | 7/2003 | Berding et al. | |
| 6,621,653 B1 | 9/2003 | Schirle | |
| 6,621,658 B1 | 9/2003 | Nashif | |
| 6,636,388 B2 | 10/2003 | Stefansky | |
| 6,639,761 B1 | 10/2003 | Boutaghou et al. | |
| 6,647,621 B1 | 11/2003 | Roen et al. | |
| 6,653,763 B2 | 11/2003 | Wang et al. | |
| 6,661,617 B1 | 12/2003 | Hipwell, Jr. et al. | |
| 6,661,618 B2 | 12/2003 | Fujiwara et al. | |
| 6,704,157 B2 | 3/2004 | Himes et al. | |

(56) References Cited

U.S. PATENT DOCUMENTS

| | | | |
|---|---|---|---|
| 6,704,158 B2 | 3/2004 | Hawwa et al. | |
| 6,704,165 B2 | 3/2004 | Kube et al. | |
| 6,711,930 B2 | 3/2004 | Thom et al. | |
| 6,714,384 B2 | 3/2004 | Himes et al. | |
| 6,714,385 B1 | 3/2004 | Even et al. | |
| 6,724,580 B2 | 4/2004 | Irie et al. | |
| 6,728,057 B2 | 4/2004 | Putnam | |
| 6,728,077 B1* | 4/2004 | Murphy | G11B 5/5552 360/294.4 |
| 6,731,472 B2 | 5/2004 | Okamoto et al. | |
| 6,735,052 B2 | 5/2004 | Dunn et al. | |
| 6,735,055 B1* | 5/2004 | Crane | G11B 5/5552 360/294.5 |
| 6,737,931 B2 | 5/2004 | Amparan et al. | |
| 6,738,225 B1 | 5/2004 | Summers et al. | |
| 6,741,424 B1 | 5/2004 | Danielson et al. | |
| 6,751,062 B2 | 6/2004 | Kasajima et al. | |
| 6,752,661 B2 | 6/2004 | Gu et al. | |
| 6,760,182 B2 | 7/2004 | Bement et al. | |
| 6,760,194 B2 | 7/2004 | Shiraishi et al. | |
| 6,760,196 B1* | 7/2004 | Niu | G11B 5/5552 360/245 |
| 6,762,913 B1 | 7/2004 | Even et al. | |
| 6,765,761 B2 | 7/2004 | Arya | |
| 6,771,466 B2 | 8/2004 | Kasajima et al. | |
| 6,771,467 B2 | 8/2004 | Kasajima et al. | |
| 6,789,593 B1 | 9/2004 | Aono et al. | |
| 6,791,802 B2 | 9/2004 | Watanabe et al. | |
| 6,796,018 B1 | 9/2004 | Thornton | |
| 6,797,888 B2 | 9/2004 | Ookawa et al. | |
| 6,798,597 B1 | 9/2004 | Aram et al. | |
| 6,801,402 B1 | 10/2004 | Subrahmanyam et al. | |
| 6,802,496 B1 | 10/2004 | Preta | |
| 6,831,539 B1 | 12/2004 | Hipwell, Jr. et al. | |
| 6,833,978 B2 | 12/2004 | Shum et al. | |
| 6,839,204 B2 | 1/2005 | Shiraishi et al. | |
| 6,841,737 B2 | 1/2005 | Komatsubara et al. | |
| 6,856,075 B1 | 2/2005 | Houk et al. | |
| 6,859,345 B2 | 2/2005 | Boutaghou et al. | |
| 6,870,091 B2 | 3/2005 | Seidler | |
| 6,882,506 B2 | 4/2005 | Yamaoka et al. | |
| 6,891,700 B2 | 5/2005 | Shiraishi et al. | |
| 6,898,042 B2* | 5/2005 | Subrahmanyan | G11B 5/5552 360/294.3 |
| 6,900,967 B1 | 5/2005 | Coon et al. | |
| 6,922,305 B2 | 7/2005 | Price | |
| 6,934,127 B2 | 8/2005 | Yao et al. | |
| 6,942,817 B2 | 9/2005 | Yagi et al. | |
| 6,943,991 B2 | 9/2005 | Yao et al. | |
| 6,950,288 B2 | 9/2005 | Yao et al. | |
| 6,961,221 B1 | 11/2005 | Niu et al. | |
| 6,963,471 B2 | 11/2005 | Arai et al. | |
| 6,975,488 B1 | 12/2005 | Kulangara et al. | |
| 6,977,790 B1 | 12/2005 | Chen et al. | |
| 7,006,333 B1* | 2/2006 | Summers | G11B 5/4826 360/245.7 |
| 7,016,159 B1 | 3/2006 | Bjorstrom et al. | |
| 7,020,949 B2 | 4/2006 | Muramatsu et al. | |
| 7,023,667 B2 | 4/2006 | Shum | |
| 7,050,267 B2 | 5/2006 | Koh et al. | |
| 7,057,857 B1* | 6/2006 | Niu | G11B 5/4826 360/245.4 |
| 7,064,928 B2 | 6/2006 | Fu et al. | |
| 7,068,473 B2 | 6/2006 | O'Neill | |
| 7,079,357 B1 | 7/2006 | Kulangara et al. | |
| 7,082,670 B2 | 8/2006 | Boismier et al. | |
| 7,092,215 B2 | 8/2006 | Someya et al. | |
| 7,099,115 B2 | 8/2006 | Yao et al. | |
| 7,099,117 B1 | 8/2006 | Subrahmanyam et al. | |
| 7,129,418 B2 | 10/2006 | Aonuma et al. | |
| 7,130,159 B2 | 10/2006 | Shimizu et al. | |
| 7,132,607 B2 | 11/2006 | Yoshimi et al. | |
| 7,142,395 B2 | 11/2006 | Swanson et al. | |
| 7,144,687 B2 | 12/2006 | Fujisaki et al. | |
| 7,158,348 B2 | 1/2007 | Erpelding et al. | |
| 7,159,300 B2 | 1/2007 | Yao et al. | |
| 7,161,765 B2* | 1/2007 | Ichikawa | G11B 5/40 360/234.5 |
| 7,161,767 B2 | 1/2007 | Hernandez et al. | |
| 7,177,119 B1 | 2/2007 | Bennin et al. | |
| 7,185,409 B1 | 3/2007 | Myers | |
| 7,218,481 B1 | 5/2007 | Bennin et al. | |
| 7,256,968 B1 | 8/2007 | Krinke | |
| 7,271,958 B2 | 9/2007 | Yoon et al. | |
| 7,283,331 B2 | 10/2007 | Oh et al. | |
| 7,288,590 B2 | 10/2007 | Lechat et al. | |
| 7,292,413 B1 | 11/2007 | Coon | |
| 7,307,817 B1 | 12/2007 | Mei | |
| 7,322,241 B2 | 1/2008 | Kai | |
| 7,336,436 B2 | 2/2008 | Sharma et al. | |
| 7,336,444 B2 | 2/2008 | Kido et al. | |
| 7,338,693 B2 | 3/2008 | Shikano et al. | |
| 7,342,750 B2 | 3/2008 | Yang et al. | |
| 7,345,851 B2* | 3/2008 | Hirano | G11B 5/4826 360/294.4 |
| 7,375,930 B2 | 5/2008 | Yang et al. | |
| 7,379,274 B2* | 5/2008 | Yao | G11B 5/4826 360/294.4 |
| 7,382,582 B1 | 6/2008 | Cuevas | |
| 7,384,531 B1 | 6/2008 | Peltoma et al. | |
| 7,385,788 B2 | 6/2008 | Kubota et al. | |
| 7,388,733 B2 | 6/2008 | Swanson et al. | |
| 7,391,594 B2 | 6/2008 | Fu et al. | |
| 7,403,357 B1 | 7/2008 | Williams | |
| 7,408,745 B2 | 8/2008 | Yao et al. | |
| 7,417,830 B1 | 8/2008 | Kulangara | |
| 7,420,778 B2 | 9/2008 | Sassine et al. | |
| 7,459,835 B1 | 12/2008 | Mei et al. | |
| 7,460,337 B1 | 12/2008 | Mei | |
| 7,466,520 B2* | 12/2008 | White | G11B 5/4826 360/294.4 |
| 7,499,246 B2* | 3/2009 | Nakagawa | G11B 5/5526 360/294.4 |
| 7,509,859 B2 | 3/2009 | Kai | |
| 7,518,830 B1 | 4/2009 | Panchal et al. | |
| 7,567,410 B1 | 7/2009 | Zhang et al. | |
| 7,595,965 B1 | 9/2009 | Kulangara et al. | |
| RE40,975 E | 11/2009 | Evans et al. | |
| 7,625,654 B2 | 12/2009 | Vyas et al. | |
| 7,629,539 B2 | 12/2009 | Ishii et al. | |
| 7,636,222 B1 | 12/2009 | Dobosz et al. | |
| 7,643,252 B2 | 1/2010 | Arai et al. | |
| 7,649,254 B2 | 1/2010 | Graydon et al. | |
| 7,663,841 B2 | 2/2010 | Budde et al. | |
| 7,667,921 B2 | 2/2010 | Satoh et al. | |
| 7,675,713 B2 | 3/2010 | Ogawa et al. | |
| 7,688,552 B2 | 3/2010 | Yao et al. | |
| 7,692,899 B2 | 4/2010 | Arai et al. | |
| 7,697,237 B1 | 4/2010 | Danielson | |
| 7,701,673 B2 | 4/2010 | Wang et al. | |
| 7,701,674 B2 | 4/2010 | Arai | |
| 7,710,687 B1 | 5/2010 | Carlson et al. | |
| 7,710,688 B1 | 5/2010 | Hentges et al. | |
| 7,719,798 B2 | 5/2010 | Yao | |
| 7,724,476 B1 | 5/2010 | Bjorstrom et al. | |
| 7,724,478 B2 | 5/2010 | Deguchi et al. | |
| 7,751,153 B1 | 7/2010 | Kulangara et al. | |
| 7,768,746 B2* | 8/2010 | Yao | G11B 5/4826 360/294.4 |
| 7,782,572 B2 | 8/2010 | Pro | |
| 7,804,663 B2 | 9/2010 | Hirano et al. | |
| 7,813,083 B2 | 10/2010 | Guo et al. | |
| 7,813,084 B1 | 10/2010 | Hentges | |
| 7,821,742 B1 | 10/2010 | Mei | |
| 7,826,177 B1 | 11/2010 | Zhang et al. | |
| 7,832,082 B1 | 11/2010 | Hentges et al. | |
| 7,835,113 B1 | 11/2010 | Douglas | |
| 7,872,344 B2 | 1/2011 | Fjelstad et al. | |
| 7,875,804 B1 | 1/2011 | Tronnes et al. | |
| 7,902,639 B2 | 3/2011 | Garrou et al. | |
| 7,914,926 B2 | 3/2011 | Kimura et al. | |
| 7,923,644 B2 | 4/2011 | Ishii et al. | |
| 7,924,530 B1 | 4/2011 | Chocholaty | |

(56) References Cited

U.S. PATENT DOCUMENTS

| | | | |
|---|---|---|---|
| 7,929,252 B1 | 4/2011 | Hentges et al. | |
| 7,946,010 B1 | 5/2011 | Myers et al. | |
| 7,983,008 B2 | 7/2011 | Liao et al. | |
| 7,986,494 B2 | 7/2011 | Pro | |
| 8,004,798 B1 | 8/2011 | Dunn | |
| 8,072,708 B2 | 12/2011 | Horiuchi | |
| 8,085,506 B1* | 12/2011 | Ee | G11B 5/4833 360/245.3 |
| 8,085,508 B2* | 12/2011 | Hatch | G11B 5/5552 360/245.3 |
| 8,089,728 B2 | 1/2012 | Yao et al. | |
| 8,120,878 B1 | 2/2012 | Drape et al. | |
| 8,125,736 B2 | 2/2012 | Nojima et al. | |
| 8,125,741 B2* | 2/2012 | Shelor | G11B 5/4826 360/294.4 |
| 8,144,430 B2 | 3/2012 | Hentges et al. | |
| 8,144,436 B2 | 3/2012 | Iriuchijima et al. | |
| 8,149,542 B2 | 4/2012 | Ando et al. | |
| 8,149,545 B1 | 4/2012 | Chai et al. | |
| 8,151,440 B2 | 4/2012 | Tsutsumi et al. | |
| 8,154,827 B2 | 4/2012 | Contreras et al. | |
| 8,157,947 B2 | 4/2012 | Kim | |
| 8,161,626 B2 | 4/2012 | Ikeji | |
| 8,169,746 B1 | 5/2012 | Rice et al. | |
| 8,174,797 B2 | 5/2012 | Iriuchijima | |
| 8,189,281 B2 | 5/2012 | Alex et al. | |
| 8,189,301 B2 | 5/2012 | Schreiber | |
| 8,194,359 B2 | 6/2012 | Yao et al. | |
| 8,199,441 B2 | 6/2012 | Nojima | |
| 8,199,442 B2 | 6/2012 | Okawara et al. | |
| 8,228,642 B1 | 7/2012 | Hahn et al. | |
| 8,233,240 B2 | 7/2012 | Contreras et al. | |
| 8,248,731 B2 | 8/2012 | Fuchino | |
| 8,248,734 B2 | 8/2012 | Fuchino | |
| 8,248,735 B2 | 8/2012 | Fujimoto et al. | |
| 8,248,736 B2 | 8/2012 | Hanya et al. | |
| 8,254,062 B2 | 8/2012 | Greminger | |
| 8,259,416 B1 | 9/2012 | Davis et al. | |
| 8,264,797 B2 | 9/2012 | Emley | |
| 8,284,524 B2 | 10/2012 | Meyer | |
| 8,289,652 B2* | 10/2012 | Zambri | G11B 5/483 360/234.5 |
| 8,289,656 B1 | 10/2012 | Huber | |
| 8,295,012 B1 | 10/2012 | Tian et al. | |
| 8,296,929 B2 | 10/2012 | Hentges et al. | |
| 8,300,362 B2 | 10/2012 | Virmani et al. | |
| 8,300,363 B2 | 10/2012 | Arai et al. | |
| 8,305,712 B2 | 11/2012 | Contreras et al. | |
| 8,310,790 B1* | 11/2012 | Fanslau, Jr. | G11B 5/483 360/294.4 |
| 8,331,060 B2* | 12/2012 | Kashima | G11B 5/4833 360/244.8 |
| 8,331,061 B2 | 12/2012 | Hanya et al. | |
| 8,339,748 B2 | 12/2012 | Shum et al. | |
| 8,351,160 B2 | 1/2013 | Fujimoto | |
| 8,363,361 B2 | 1/2013 | Hanya et al. | |
| 8,369,046 B2 | 2/2013 | Nojima | |
| 8,379,349 B1 | 2/2013 | Pro et al. | |
| 8,395,865 B2* | 3/2013 | Anandan | G11B 5/4833 360/244.3 |
| 8,405,933 B2 | 3/2013 | Soga | |
| 8,405,934 B2 | 3/2013 | Fuchino | |
| 8,446,694 B1 | 5/2013 | Tian et al. | |
| 8,456,780 B1 | 6/2013 | Ruiz | |
| 8,498,082 B1 | 7/2013 | Padeski et al. | |
| 8,503,133 B2 | 8/2013 | Arai et al. | |
| 8,508,888 B2 | 8/2013 | Ohsawa | |
| 8,526,142 B1 | 9/2013 | Dejkoonmak et al. | |
| 8,542,465 B2 | 9/2013 | Liu et al. | |
| 8,553,364 B1 | 10/2013 | Schreiber et al. | |
| 8,559,137 B2 | 10/2013 | Imuta | |
| 8,582,243 B2 | 11/2013 | Feng et al. | |
| 8,593,764 B1 | 11/2013 | Tian et al. | |
| 8,630,067 B2 | 1/2014 | Ando et al. | |
| 8,634,166 B2 | 1/2014 | Ohnuki et al. | |
| 8,665,565 B2 | 3/2014 | Pro et al. | |
| 8,665,567 B2 | 3/2014 | Shum et al. | |
| 8,675,314 B1 | 3/2014 | Bjorstrom et al. | |
| 8,681,456 B1 | 3/2014 | Miller et al. | |
| 8,717,712 B1 | 5/2014 | Bennin et al. | |
| 8,741,195 B2 | 6/2014 | Kurihara et al. | |
| 8,780,503 B2 | 7/2014 | Wright et al. | |
| 8,792,214 B1 | 7/2014 | Bjorstrom et al. | |
| 8,834,660 B1 | 9/2014 | Scheele et al. | |
| 8,885,297 B1 | 11/2014 | Bjorstrom et al. | |
| 8,891,206 B2* | 11/2014 | Miller | G11B 5/4826 360/245 |
| 8,896,968 B2* | 11/2014 | Miller | G11B 5/4826 360/245 |
| 8,896,969 B1* | 11/2014 | Miller | G11B 5/4873 360/294.4 |
| 8,896,970 B1 | 11/2014 | Miller et al. | |
| 9,007,726 B2 | 4/2015 | Bennin et al. | |
| 9,036,302 B2 | 5/2015 | Bjorstrom et al. | |
| 9,070,392 B1* | 6/2015 | Bjorstrom | G11B 5/4873 |
| 9,093,117 B2 | 7/2015 | Tobias | |
| 9,117,468 B1 | 8/2015 | Zhang et al. | |
| 9,147,413 B2 | 9/2015 | Miller et al. | |
| 9,240,203 B2 | 1/2016 | Miller et al. | |
| 9,245,555 B2 | 1/2016 | Bennin et al. | |
| 9,257,139 B2* | 2/2016 | Miller | G11B 5/4826 |
| 9,296,188 B1 | 3/2016 | Cray et al. | |
| 9,330,697 B2 | 5/2016 | Miller et al. | |
| 2001/0001937 A1 | 5/2001 | Benes et al. | |
| 2001/0012181 A1 | 8/2001 | Inoue et al. | |
| 2001/0013993 A1 | 8/2001 | Coon | |
| 2001/0030838 A1 | 10/2001 | Takadera et al. | |
| 2001/0043443 A1 | 11/2001 | Okamoto et al. | |
| 2002/0012194 A1* | 1/2002 | Inagaki | G11B 5/484 360/78.08 |
| 2002/0075606 A1 | 6/2002 | Nishida et al. | |
| 2002/0118492 A1 | 8/2002 | Watanabe et al. | |
| 2002/0149888 A1 | 10/2002 | Motonishi et al. | |
| 2002/0159845 A1 | 10/2002 | Mikell | |
| 2002/0168897 A1 | 11/2002 | Chang | |
| 2002/0176209 A1 | 11/2002 | Schulz et al. | |
| 2002/0178778 A1 | 12/2002 | Thom et al. | |
| 2003/0011118 A1 | 1/2003 | Kasajima et al. | |
| 2003/0011936 A1 | 1/2003 | Himes et al. | |
| 2003/0051890 A1 | 3/2003 | Marshall | |
| 2003/0053258 A1 | 3/2003 | Dunn et al. | |
| 2003/0089520 A1 | 5/2003 | Ooyabu et al. | |
| 2003/0135985 A1 | 7/2003 | Yao et al. | |
| 2003/0174445 A1 | 9/2003 | Luo | |
| 2003/0202293 A1 | 10/2003 | Nakamura et al. | |
| 2003/0210499 A1 | 11/2003 | Arya | |
| 2004/0007322 A1 | 1/2004 | Lechat et al. | |
| 2004/0008449 A1 | 1/2004 | Girard | |
| 2004/0027727 A1 | 2/2004 | Shimizu et al. | |
| 2004/0027728 A1 | 2/2004 | Coffey et al. | |
| 2004/0032093 A1 | 2/2004 | Razavi | |
| 2004/0070884 A1 | 4/2004 | Someya et al. | |
| 2004/0084198 A1 | 5/2004 | Seidler | |
| 2004/0125508 A1* | 7/2004 | Yang | G11B 5/5552 360/294.3 |
| 2004/0181932 A1 | 9/2004 | Yao et al. | |
| 2004/0207957 A1 | 10/2004 | Kasajima et al. | |
| 2004/0221447 A1 | 11/2004 | Ishii et al. | |
| 2004/0250952 A1 | 12/2004 | Lechat et al. | |
| 2004/0264056 A1 | 12/2004 | Jang et al. | |
| 2005/0045914 A1 | 3/2005 | Agranat et al. | |
| 2005/0060864 A1 | 3/2005 | Nikolaidis et al. | |
| 2005/0061542 A1 | 3/2005 | Aonuma et al. | |
| 2005/0063097 A1 | 3/2005 | Maruyama et al. | |
| 2005/0101983 A1 | 5/2005 | Loshakove et al. | |
| 2005/0105217 A1* | 5/2005 | Kwon | G11B 5/012 360/245.3 |
| 2005/0117257 A1 | 6/2005 | Thaveeprungsriporn et al. | |
| 2005/0180053 A1 | 8/2005 | Dovek et al. | |
| 2005/0254175 A1 | 11/2005 | Swanson et al. | |
| 2005/0280944 A1 | 12/2005 | Yang et al. | |
| 2006/0044698 A1 | 3/2006 | Hirano et al. | |
| 2006/0077594 A1 | 4/2006 | White et al. | |

(56) References Cited

U.S. PATENT DOCUMENTS

| | | |
|---|---|---|
| 2006/0181812 A1 | 8/2006 | Kwon et al. |
| 2006/0193086 A1* | 8/2006 | Zhu ................... G11B 5/4853 360/294.4 |
| 2006/0209465 A1 | 9/2006 | Takikawa et al. |
| 2006/0238924 A1* | 10/2006 | Gatzen ................ G11B 5/5552 360/294.4 |
| 2006/0248702 A1 | 11/2006 | Nikolaidis et al. |
| 2006/0274452 A1 | 12/2006 | Arya |
| 2006/0274453 A1 | 12/2006 | Arya |
| 2006/0279880 A1 | 12/2006 | Boutaghou et al. |
| 2007/0005072 A1 | 1/2007 | Castillo et al. |
| 2007/0041123 A1 | 2/2007 | Swanson et al. |
| 2007/0057548 A1 | 3/2007 | Buffa |
| 2007/0133128 A1 | 6/2007 | Arai |
| 2007/0153430 A1 | 7/2007 | Park et al. |
| 2007/0223146 A1* | 9/2007 | Yao .................... G11B 5/4826 360/294.4 |
| 2007/0227769 A1 | 10/2007 | Brodsky et al. |
| 2007/0253176 A1 | 11/2007 | Ishii et al. |
| 2008/0024928 A1 | 1/2008 | Yang |
| 2008/0024933 A1 | 1/2008 | Yao et al. |
| 2008/0071302 A1 | 3/2008 | Castillo et al. |
| 2008/0084638 A1 | 4/2008 | Bonin |
| 2008/0124842 A1 | 5/2008 | Wang et al. |
| 2008/0144225 A1 | 6/2008 | Yao et al. |
| 2008/0192384 A1 | 8/2008 | Danielson et al. |
| 2008/0198511 A1* | 8/2008 | Hirano ................ G11B 5/5552 360/294.4 |
| 2008/0229842 A1 | 9/2008 | Ohtsuka et al. |
| 2008/0247131 A1 | 10/2008 | Hitomi et al. |
| 2008/0251201 A1 | 10/2008 | Sikkel et al. |
| 2008/0264557 A1 | 10/2008 | Kim |
| 2008/0272122 A1 | 11/2008 | Son |
| 2008/0273266 A1 | 11/2008 | Pro |
| 2008/0273269 A1 | 11/2008 | Pro |
| 2009/0027807 A1 | 1/2009 | Yao et al. |
| 2009/0080117 A1 | 3/2009 | Shimizu et al. |
| 2009/0135523 A1 | 5/2009 | Nishiyama et al. |
| 2009/0147407 A1 | 6/2009 | Huang et al. |
| 2009/0168249 A1 | 7/2009 | McCaslin et al. |
| 2009/0176120 A1 | 7/2009 | Wang |
| 2009/0183359 A1 | 7/2009 | Tsutsumi et al. |
| 2009/0190263 A1 | 7/2009 | Miura et al. |
| 2009/0244786 A1* | 10/2009 | Hatch ................. G11B 5/5552 360/294.4 |
| 2009/0284870 A1 | 11/2009 | Nojima et al. |
| 2009/0294740 A1 | 12/2009 | Kurtz et al. |
| 2010/0007993 A1 | 1/2010 | Contreras et al. |
| 2010/0067151 A1 | 3/2010 | Okawara et al. |
| 2010/0073825 A1 | 3/2010 | Okawara |
| 2010/0097726 A1 | 4/2010 | Greminger et al. |
| 2010/0142081 A1 | 6/2010 | Funabashi et al. |
| 2010/0143743 A1 | 6/2010 | Yamasaki et al. |
| 2010/0165515 A1 | 7/2010 | Ando |
| 2010/0165516 A1 | 7/2010 | Fuchino |
| 2010/0177445 A1 | 7/2010 | Fuchino |
| 2010/0195251 A1* | 8/2010 | Nojima ................ G11B 5/4826 360/245.3 |
| 2010/0195252 A1 | 8/2010 | Kashima |
| 2010/0208390 A1 | 8/2010 | Hanya et al. |
| 2010/0208425 A1 | 8/2010 | Rapisarda |
| 2010/0220414 A1 | 9/2010 | Klarqvist et al. |
| 2010/0246071 A1 | 9/2010 | Nojima et al. |
| 2010/0271735 A1 | 10/2010 | Schreiber |
| 2010/0277834 A1 | 11/2010 | Nojima |
| 2010/0290158 A1 | 11/2010 | Hanya et al. |
| 2011/0013319 A1 | 1/2011 | Soga et al. |
| 2011/0058281 A1 | 3/2011 | Arai et al. |
| 2011/0058282 A1* | 3/2011 | Fujimoto ............. G11B 5/4833 360/246.2 |
| 2011/0075301 A1* | 3/2011 | Tsuchiya ............. G11B 5/4826 360/245.3 |
| 2011/0096438 A1* | 4/2011 | Takada ................ G11B 5/4853 360/244.2 |
| 2011/0096440 A1 | 4/2011 | Greminger |
| 2011/0123145 A1 | 5/2011 | Nishio |
| 2011/0141624 A1 | 6/2011 | Fuchino et al. |
| 2011/0141626 A1 | 6/2011 | Contreras et al. |
| 2011/0159767 A1 | 6/2011 | Sakurai et al. |
| 2011/0228425 A1 | 9/2011 | Liu et al. |
| 2011/0242708 A1 | 10/2011 | Fuchino |
| 2011/0279929 A1 | 11/2011 | Kin |
| 2011/0299197 A1 | 12/2011 | Eguchi |
| 2011/0299288 A1 | 12/2011 | Rapisarda |
| 2012/0000376 A1 | 1/2012 | Kurihara et al. |
| 2012/0002329 A1 | 1/2012 | Shum et al. |
| 2012/0081813 A1 | 4/2012 | Ezawa et al. |
| 2012/0081815 A1 | 4/2012 | Arai et al. |
| 2012/0087041 A1* | 4/2012 | Ohsawa ............... G11B 5/4826 360/234.5 |
| 2012/0099226 A1* | 4/2012 | Zambri ................ G11B 5/483 360/245.3 |
| 2012/0113547 A1 | 5/2012 | Sugimoto |
| 2012/0176703 A1* | 7/2012 | Nojima ................ H01L 41/338 360/244.2 |
| 2012/0180956 A1 | 7/2012 | Kim |
| 2012/0248759 A1 | 10/2012 | Feith |
| 2012/0276232 A1 | 11/2012 | Marczyk et al. |
| 2012/0279757 A1 | 11/2012 | Ishii et al. |
| 2012/0281316 A1 | 11/2012 | Fujimoto et al. |
| 2012/0285306 A1 | 11/2012 | Weibelt |
| 2013/0020112 A1* | 1/2013 | Ohsawa ............... G11B 5/486 174/255 |
| 2013/0021698 A1 | 1/2013 | Greminger et al. |
| 2013/0047807 A1 | 2/2013 | Sotokawa et al. |
| 2013/0055561 A1 | 3/2013 | Tsutsumi et al. |
| 2013/0107488 A1 | 5/2013 | Arai |
| 2013/0176646 A1 | 7/2013 | Arai |
| 2013/0242434 A1 | 9/2013 | Bjorstrom et al. |
| 2013/0242436 A1 | 9/2013 | Yonekura et al. |
| 2013/0248231 A1 | 9/2013 | Tobias |
| 2013/0265674 A1* | 10/2013 | Fanslau ............... C23C 28/00 360/245.3 |
| 2013/0279042 A1 | 10/2013 | Xiong et al. |
| 2014/0022670 A1* | 1/2014 | Takikawa ............. G11B 5/486 360/234.4 |
| 2014/0022671 A1 | 1/2014 | Takikawa et al. |
| 2014/0022674 A1 | 1/2014 | Takikawa et al. |
| 2014/0022675 A1 | 1/2014 | Hanya et al. |
| 2014/0063660 A1 | 3/2014 | Bjorstrom et al. |
| 2014/0078621 A1 | 3/2014 | Miller et al. |
| 2014/0085754 A1 | 3/2014 | Hanya et al. |
| 2014/0085755 A1 | 3/2014 | Hanya et al. |
| 2014/0098440 A1 | 4/2014 | Miller et al. |
| 2014/0146649 A1 | 5/2014 | Bennin et al. |
| 2014/0168821 A1 | 6/2014 | Miller |
| 2014/0198412 A1 | 7/2014 | Miller et al. |
| 2014/0216221 A1 | 8/2014 | Mashima |
| 2014/0362475 A1 | 12/2014 | Bjorstrom et al. |
| 2014/0362476 A1 | 12/2014 | Miller et al. |
| 2015/0016235 A1 | 1/2015 | Bennin et al. |
| 2015/0055254 A1 | 2/2015 | Bjorstrom et al. |
| 2015/0055255 A1 | 2/2015 | Bennin et al. |
| 2015/0055256 A1 | 2/2015 | Miller |
| 2015/0062758 A1 | 3/2015 | Miller et al. |
| 2015/0162033 A1 | 6/2015 | Miller et al. |
| 2015/0194170 A1 | 7/2015 | Roen |
| 2015/0194176 A1 | 7/2015 | Scheele et al. |
| 2015/0356987 A1 | 12/2015 | Bennin et al. |

FOREIGN PATENT DOCUMENTS

| | | |
|---|---|---|
| JP | 9198825 A | 7/1997 |
| JP | 10003632 A | 1/1998 |
| JP | 2001057039 A | 2/2001 |
| JP | 2001202731 A | 7/2001 |
| JP | 2001307442 A | 11/2001 |
| JP | 2002050140 A | 2/2002 |
| JP | 2002170607 A | 6/2002 |
| JP | 2003223771 A | 8/2003 |
| JP | 2003234549 A | 8/2003 |
| JP | 2004039056 A | 2/2004 |

(56) References Cited

FOREIGN PATENT DOCUMENTS

| JP | 2004300489 A | 10/2004 |
|---|---|---|
| JP | 2005209336 A | 8/2005 |
| JP | 2007115864 A | 5/2007 |
| JP | 2008276927 A | 11/2008 |
| JP | 2015130221 A | 7/2015 |
| JP | 2015130225 A | 7/2015 |
| WO | WO9820485 A1 | 5/1998 |
| WO | 2014021440 A1 | 2/2014 |
| WO | WO2014190001 A1 | 11/2014 |
| WO | 2015009733 A1 | 1/2015 |
| WO | 2015027034 A2 | 2/2015 |

OTHER PUBLICATIONS

International Search Report and Written Opinion issued in PCT/US2013/059702, dated Mar. 28, 2014, 9 pages.
"Calculating VLSI Wiring Capacitance", Jun. 1990, IBM Technical Disclosure Bulletin, vol. 33, Issue No. 1A, 2 pages.
3M Ultra_pure Viscoelastic Damping Polymer 242NRO1, Technical Data, Mar. 2012, 4 pages.
Cheng, Yang-Tse, "Vapor deposited thin gold coatings for high temperature electrical contacts", Electrical Contacts, 1996, Joint with the 18th International Conference on Electrical Contacts, Proceedings of the Forty-Second IEEE Holm Conference, Sep. 16-20, 1996 (abstract only), 3 pages.
Fu, Yao, "Design of a Hybrid Magnetic and Piezoelectric Polymer Microactuator", a thesis submitted to Industrial Research Institute Swinbume (IRIS), Swinburne University of Technology, Hawthorn, Victoria, Australia, Dec. 2005, 231 pages.
Harris, N.R. et al., "A Multilayer Thick-film PZT Actuator for MEMs Applications", Sensors and Actuators A: Physical, vol. 132, No. 1, Nov. 8, 2006, pp. 311-316.
Hentges, Reed T. et al., "Exploring Low Loss Suspension Interconnects for High Data Rates in Hard Disk Drives", IEEE Transactions on Magnetics, vol. 44, No. 1, Jan. 2008, pp. 169-174.
International Preliminary Examination Report issued in PCT/US2013/075320, completed Jun. 23, 2015, 7 pages.
International Preliminary Report on Patentability issued in PCT/US2013/052885, completed Mar. 3, 2015, 10 pages.
International Preliminary Report on Patentability issued in PCT/US2013/059702, completed Mar. 17, 2015, 6 pages.
International Preliminary Report on Patentability issued in PCT/US2014/038894, mailed Dec. 3, 2015, 6 pages.
International Preliminary Report on Patentability issued in PCT/US2014/046714, mailed Jan. 28, 2016, 8 pages.
International Preliminary Report on Patentability issued in PCT/US2014/047356, mailed Feb. 4, 2016, 9 pages.
International Preliminary Report on Patentability issued in PCT/US2014/052042, mailed Mar. 3, 2016, 7 pages.
International Search Report and Written Opinion issued in PCT/US13175320, mailed May 20, 2014, 10 pages.
International Search Report and Written Opinion issued in PCT/US2013/031484, mailed May 30, 2013, 13 pages.
International Search Report and Written Opinion issued in PCT/US2013/033341, mailed Jun. 14, 2013, 9 pages.
International Search Report and Written Opinion issued in PCT/US2013/052885, mailed Feb. 7, 2014, 13 pages.
International Search Report and Written Opinion issued in PCT/US2013/052885, mailed Feb. 7, 2014, 16 pages.
International Search Report and Written Opinion issued in PCT/US2013/064314, dated Apr. 18, 2014, 10 pages.
International Search Report and Written Opinion issued in PCT/US2014/046714, mailed Jul. 15, 2014, 26 pages.
International Search Report and Written Opinion issued in PCT/US2014/052042, mailed Mar. 13, 2015, 10 pages.
Jing, Yang, "Fabrication of piezoelectric ceramic micro-actuator and its reliability for hard disk drives", Ultrasonics, Ferroelectrics and Frequency Control, IEEE, vol. 51, No. 11, Nov. 2004, pp. 1470-1476 (abstract only), 3 pages.
Kon, Stanley et al., "Piezoresistive and Piezoelectric MEMS Strain Sensors for Vibration Detection", Sensors and Smart Structures Technologies for Civil, Mechanical, and Aerospace Systems 2007, Proc. of SPIE vol. 6529, 11 pages.
Lengert, David et al., "Design of suspension-based and collocated dual stage actuated suspensions", Microsyst Technol (2012) 18:1615-1622, 8 pages.
Li, Longqiu et al., "An experimental study of the dimple-gimbal interface in a hard disk drive", Microsyst Technol (2011) 17:863-868.
Pichonat, Tristan et al., "Recent developments in MEMS-based miniature fuel cells", Microsyst Technol (2007) 13:1671-1678.
Pozar, David M. Microwave Engineering, 4th Edition, copyright 2012 by John Wiley & Sons, Inc., pp. 422-426.
Raeymaekers, B. et al., "Investigation of fretting wear at the dimple/gimbal interface in a hard disk drive suspension", Near, vol. 268, Issues 11-12, May 12, 2010, pp. 1347-1353.
Raeymaekers, Bart et al., "Fretting Wear Between a Hollow Sphere and Flat Surface", Proceedings of the STLE/ASME International Joint Tribology Conference, Oct. 19-21, 2009, Memphis, TN USA, 4 pages.
Rajagopal, Indira et al., "Gold Plating of Critical Components for Space Applications: Challenges and Solutions", Gold Bull., 1992, 25(2), pp. 55-66.
U.S. Appl. No. 13/365,443 to Miller, Mark A., entitled Elongated Trace Tethers for Disk Drive Head Suspension Flexures, filed Feb. 3, 2012, 33 pages.
U.S. Appl. No. 13/690,883 to Tobias, Kyle T. et al., entitled Microstructure Patterned Surfaces for Integrated Lead Head Suspensions, filed Nov. 30, 2012, 43 pages.
U.S. Appl. No. 13/827,622 to Bjorstrom, Jacob D. et al., entitled Mid-Loadbeam Dual Stage Actuated (DSA) Disk Drive Head Suspension, filed Mar. 14, 2013, 34 pages.
U.S. Appl. No. 14/056,481 entitled Two-Motor Co-Located Gimbal-Based Dual Stage Actuation Disk Drive Suspensions With Motor Stiffeners, filed Oct. 17, 2013, 102 pages.
U.S. Appl. No. 14/103,955 to Bjorstrom, Jacob D. et al., entitled Electrical Contacts to Motors in Dual Stage Actuated Suspensions, filed Dec. 12, 2013, 61 pages.
U.S. Appl. No. 14/141,617 to Bennin, Jeffry S. et al., entitled Disk Drive Suspension Assembly Having a Partially Flangeless Load Point Dimple, filed Dec. 27, 2013, 53 pages.
U.S. Appl. No. 14/145,515 to Miller, Mark A. et al., entitled Balanced Co-Located Gimbal-Based Dual Stage Actuation Disk Drive Suspensions, filed Dec. 31, 2013, 39 pages.
U.S. Appl. No. 14/163,279 to Roen, Michael E. entitled Stepped Impedance Flexure Design in a Hard Disk Drive, filed Jan. 24, 2014, 25 pages.
U.S. Appl. No. 14/216,288 to Miller, Mark A. et al., entitled Co-Located Gimbal-Based Dual Stage Actuation Disk Drive Suspension, filed Mar. 17, 2014, 84 pages.
U.S. Appl. No. 61/396,239 entitled Low Resistance Ground Joints for Dual Stage Actuation Disk Drive Suspensions, filed May 24, 2010, 16 pages.
U.S. Appl. No. 13/114,212, filed May 24, 2011, 23 pages.
U.S. Appl. No. 61/396,239, filed May 24, 2010, 16 pages.
U.S. Appl. No. 13/972,137, filed Aug. 21, 2013, 28 pages.
U.S. Appl. No. 14/026,427, filed Sep. 13, 2013, 79 pages.
U.S. Appl. No. 14/050,660, filed Oct. 10, 2013, 82 pages.
U.S. Appl. No. 14/216,288, filed Sep. 14, 2012, 77, pages.
U.S. Appl. No. 14/467,582, filed Oct. 10, 2012, 81 pages.
U.S. Appl. No. 14/572,263, filed Dec. 16, 2014, 32 pages.
U.S. Appl. No. 13/955,204 to Bjorstrom, Jacob D. et al., entitled Damped Dual Stage Actuation Disk Drive Suspensions, filed Jul. 31, 2013, 35 pages.
U.S. Appl. No. 13/955,204, to Bjorstrom, Jacob D. et al., Non-Final Office Action issued on Mar. 24, 2014, 7 pages.
U.S. Appl. No. 13/955,204, to Bjorstrom, Jacob D. et al., Non-Final Office Action issued on Oct. 29, 2013, 9 pages.
U.S. Appl. No. 13/955,204, to Bjorstrom, Jacob D. et al., Notice of Allowance issued on Jan. 7, 2014, 6 pages.
U.S. Appl. No. 13/955,204, to Bjorstrom, Jacob D. et al., Notice of Allowance issued on May 6, 2014, 5 pages.

(56) References Cited

OTHER PUBLICATIONS

U.S. Appl. No. 13/955,204, to Bjorstrom, Jacob D. et al., Response filed Apr. 18, 2014 to Non-Final Office Action issued on Mar. 24, 2014, 9 pages.
U.S. Appl. No. 13/955,204, to Bjorstrom, Jacob D. et al., Response filed Nov. 19, 2013 to Non-Final Office Action issued on Oct. 29, 2013, 11 pages.
U.S. Appl. No. 13/972,137 to Bjorstrom, Jacob D. et al., entitled Co-Located Gimbal-Based Dual Stage Actuation Disk Drive Suspensions With Offset Motors, filed Aug. 21, 2013.
U.S. Appl. No. 13/972,137, to Bjorstrom, Jacob D. et al., Non-Final Office Action issued Nov. 5, 2013, 8 pages.
U.S. Appl. No. 13/972,137, to Bjorstrom, Jacob D. et al., Notice of Allowance issued on Jan. 17, 2014, 5 pages.
U.S. Appl. No. 13/972,137, to Bjorstrom, Jacob D. et al., Response tiled Dec. 2, 2013 to Non-Final Office Action issued Nov. 5, 2013, 12 pages.
U.S. Appl. No. 14/026,427 to Miller, Mark A., entitled Co-Located Gimbal-Based Dual Stage Actuation Disk Drive Suspensions, filed Sep. 13, 2013, 83 pages.
U.S. Appl. No. 14/044,238 to Miller, Mark A., entitled Co-Located Gimbal-Based Dual Stage Actuation Disk Drive Suspensions With Motor Stifeners, filed Oct. 2, 2013, 88 pages.
U.S. Appl. No. 14/044,238 to Miller, Mark A., Non-Final Office Action issued on Feb. 6, 2014, 9 pages.
U.S. Appl. No. 14/044,238, to Miller, Mark A., Response filed Apr. 22, 2014 to Non-Final Office Action issued on Feb. 6, 2014, 11 pages.
U.S. Appl. No. 14/050,660 to Miller, Mark A. et al., entitled Co-Located Gimbal-Based Dual Stage Actuation Disk Drive Suspensions With Dampers, filed Oct. 10, 2013, 86 pages.
U.S. Appl. No. 14/050,660, to Miller, Mark A. et al., Non-Final Office Action issued on Mar. 31, 2014, 9 pages.
U.S. Appl. No. 14/146,760 to Roen, Michael E entitled Balanced Multi-Trace Transmission in a Hard Disk Drive Flexure, filed Jan. 3, 2014, 32 pages.
U.S. Appl. No. 14/215,663 to Bjorstrom, Jacob D., entitled Co-Located Gimbal-Based Dual Stage Actuation Disk Drive Suspensions With Offset Motors, filed Mar. 17, 2014, 31 pages.
U.S. Appl. No. 14/270,070 to Bennin, Jeffry S. et al., entitled Disk Drive Suspension Assembly Having a Partially Flangeless Load Point Dimple, filed May 5, 2014, 59 pages.
U.S. Appl. No. 14/335,967 to Bjorstrom, Jacob D. et al., entitled Electrical Contacts to Motors in Dual Stage Actuated Suspensions, filed Jul. 21, 2014, 60 pages.
U.S. Appl. No. 14/467,543 to Bjorstrom, Jacob D. et al., entitled Damped Dual Stage Actuation Disk Drive Suspensions, filed Aug. 25, 2014, 47 pages.
U.S. Appl. No. 14/467,582 to Miller, Mark A. et al., entitled Co-Located Gimbal-Based Dual Stage Actuation Disk Drive Suspensions With Dampers, filed Aug. 25, 2014, 84 pages.
Yoon, Wonseok et al., "Evaluation of coated metallic bipolar plates for polymer electrolyte membrane fuel cells", The Journal of Power Sources, vol. 179, No. 1, Apr. 15, 2008, pp. 265-273.

* cited by examiner

PIEZOELECTRIC DISK DRIVE SUSPENSION MOTORS HAVING PLATED STIFFENERS

CROSS-REFERENCE TO RELATED APPLICATION

This application is a continuation of U.S. patent application Ser. No. 14/572,263, filed Dec. 16, 2014, which is incorporated herein by reference in its entirety for all purposes.

TECHNICAL FIELD

The present invention relates to disk drives and suspensions for disk drives. In particular, the invention is a dual stage actuation (DSA) suspension having a motor with a plated stiffener.

BACKGROUND

Dual stage actuation (DSA) disk drive head suspensions and disk drives incorporating DSA suspensions are generally known and commercially available. For example, DSA suspensions having an actuation structure on the baseplate or other mounting portion of the suspension, i.e., proximal to the spring or hinge region of the suspension, are described in U.S. Patent Publication No. 2010/0067151 to Okawara, U.S. Patent Publication No. 2012/0002329 to Shum, U.S. Patent Publication No. 2011/0242708 to Fuchino, and U.S. Pat. No. 5,714,444 to Imamura. DSA suspensions having actuation structures located on the loadbeam or gimbal portions of the suspension, i.e., distal to the spring or hinge region, are also known and disclosed, for example, in U.S. Pat. No. 5,657,188 to Jurgenson, U.S. Pat. No. 7,256,968 to Krinke, and U.S. Patent Publication No. 2008/0144225 to Yao. Co-located gimbal-based DSA suspensions are disclosed U.S. Pat. No. 8,681,456 to Miller, U.S. Pat. No. 8,891,206 to Miller, and U.S. Patent Publication No. 2014/0098440 to Miller. Each of the above-identified patents and patent applications is incorporated herein by reference in its entirety for all purposes.

There remains a continuing need for improved performance of DSA suspensions.

SUMMARY

Various embodiments concern a gimbaled flexure having a dual stage actuation structure. The flexure comprises a gimbal on which a motor is mounted. The motor comprises a first terminal, a second terminal, a first major broad side, and a second major broad side opposite the first major broad side. The first and second terminals comprise first and second conductive layers, respectively, formed from a first metal. The motor further comprises one or more layers of piezoelectric material located between the first major broad side and the second major broad side. The motor further comprises a metal stiffener disposed directly on the first terminal along the first major broad side, the stiffener comprising a second layer of a second metal. The one or more layers of piezoelectric material are configured to one or both of expand or contract upon application of a differential signal across the first and second terminals. The stiffener causes the motor to curl upon electrical activation of the piezoelectric material, which causes a portion of the flexure to preferentially curl. The motor comprises a first long side, a second long side opposite the first long side, a first end side, a second end side opposite the first end side. The stiffener is only located on the first major broad side of the motor and is not located on any of the second major broad side, the first long side, the second long side, the first end side, or the second end side. The stiffener may have a length and width to extend to one, several, or all of each of the first long side, the second long side, the first end side, and the second end side or the edge of the stiffener may be receded from such side. The first and second conductive layers can be formed from gold sputtered on the piezoelectric material. The stiffener can be plated on the gold of the first conductive layer.

Further features and modifications of the various embodiments are further discussed herein and shown in the drawings. While multiple embodiments are disclosed, still other embodiments of the present disclosure will become apparent to those skilled in the art from the following detailed description, which shows and describes illustrative embodiments of this disclosure. Accordingly, the drawings and detailed description are to be regarded as illustrative in nature and not restrictive.

While multiple embodiments are disclosed, still other embodiments within the scope of the present disclosure will become apparent to those skilled in the art from the following detailed description, which shows and describes illustrative embodiments. Accordingly, the drawings and detailed description are to be regarded as illustrative in nature and not restrictive.

DESCRIPTION OF THE INVENTION

Figure 1:
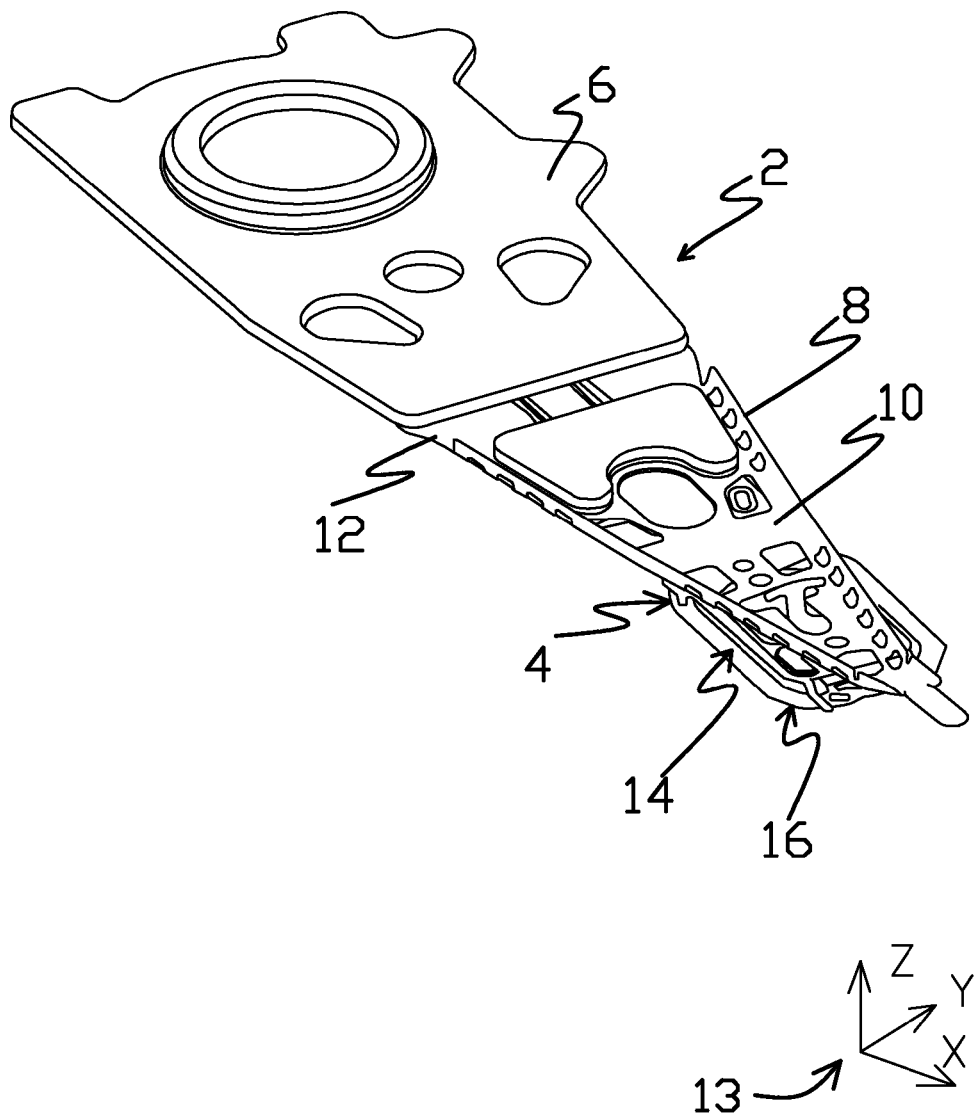
FIG. 1 is a perspective view of the loadbeam side of a suspension having a flexure with a dual stage actuation (DSA) structure.

FIG. 1 is a perspective view of the loadbeam side of a suspension 2 having a flexure 4 with a co-located or gimbal-based dual stage actuation (DSA) structure. As shown in FIG. 1, the suspension 2 includes a baseplate 6 as a proximal mounting structure. The suspension 2 includes a loadbeam 8 having a rigid or beam region 10 coupled to the baseplate 6 along a spring or hinge region 12. The loadbeam 8 can be formed from stainless steel. The flexure 4 includes a gimbal 14 at the distal end of the flexure 4. A DSA structure 16 is located on the gimbal 14, adjacent the distal end of the loadbeam 8. Proximal and distal, as used herein, refers to the relative direction along the longitudinal axis of the suspension 2. For example, the baseplate 6 is proximal of the loadbeam 8. An axes key 13 indicates X, Y, and Z axes in FIG. 1 and in subsequent FIGS. The suspension 2 is generally elongated along the X axis in distal and proximal directions. The Y axis represents lateral left and right directions. The suspension 2, including the flexure 4, are generally co-planar with an X-Y plane defined by the X and Y axes. The Z axis represents height as well as bottom and top orientations.

Figure 2:
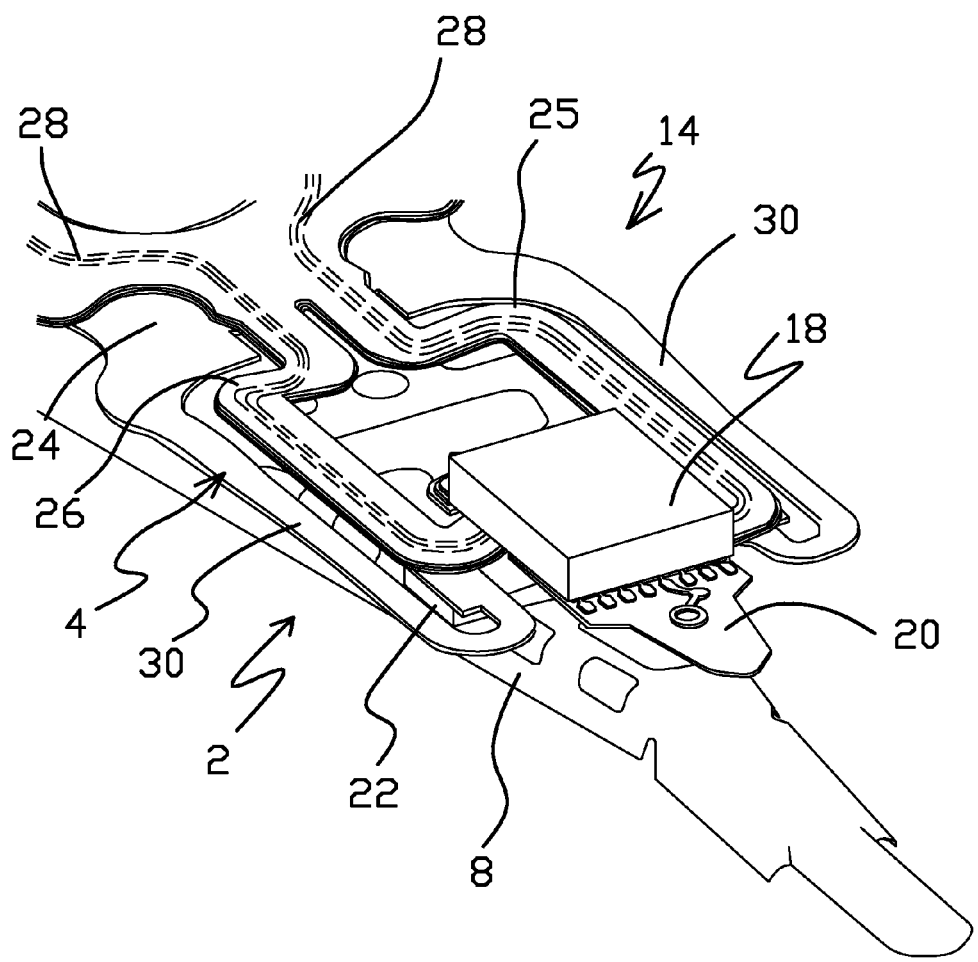
FIG. 2 is a perspective view of the flexure side (i.e., the side opposite that shown in FIG. 1) of the distal end of the suspension shown in FIG. 1.
Figure 2:
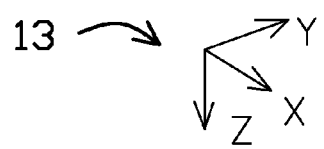

FIG. 2 is a detailed perspective view of the flexure side of the distal end of the suspension 2. FIG. 2 shows the opposite side of the suspension 2 relative to FIG. 1. A head slider 18 is mounted to a tongue 20 of the gimbal 14, on the side of the suspension 2 that is opposite the loadbeam 8. The slider 18 is mounted to a slider mounting of the tongue 20. The slider mounting is a surface of the tongue 20 to which the slider 18 (or component to which the slider 18 is attached) can be attached, such as with an adhesive such as epoxy. It will be understood that the slider 18 can be attached to a different portion of the gimbal 14. FIG. 2 further shows a motor 22 mounted on the gimbal 14.

The flexure 4 is composed of several layers, as is known in the art. The flexure 4 includes a stainless steel layer 24. The stainless steel layer 24 can serve as a structural backbone to the flexure 4. Metals other than stainless steel can be used. The stainless steel layer 24 can include spring arms 30. The stainless steel layer 24 can further include a tongue 20. The tongue 20 can be supported by the spring arms 30. For example, struts formed from the stainless steel layer 24 can bridge between the pair of spring arms 30 and the tongue 20 located there between.

The flexure 4 includes a trace portion 26. The trace portion 26 can be located partially on the stainless steel layer 24 and can extend off of the stainless steel layer 24 at various locations, such as in a flying lead segment. The trace portion 26 can comprise a plurality of traces 28 insulated by one or more dielectric layers 25. The traces 28 can be formed from copper or another conductive material. The dielectric layers 35 can be formed from polyimide or another polymer. The traces 28 can electrically connect proximally with control circuitry of a disk drive as in known in the art. The traces 28 can electrically connect distally to various components, such as the motor 22. The slider 18 can be electrically connected with one or more of the traces 28 for transmitting read and write signals along the suspension 2.

Figure 3:
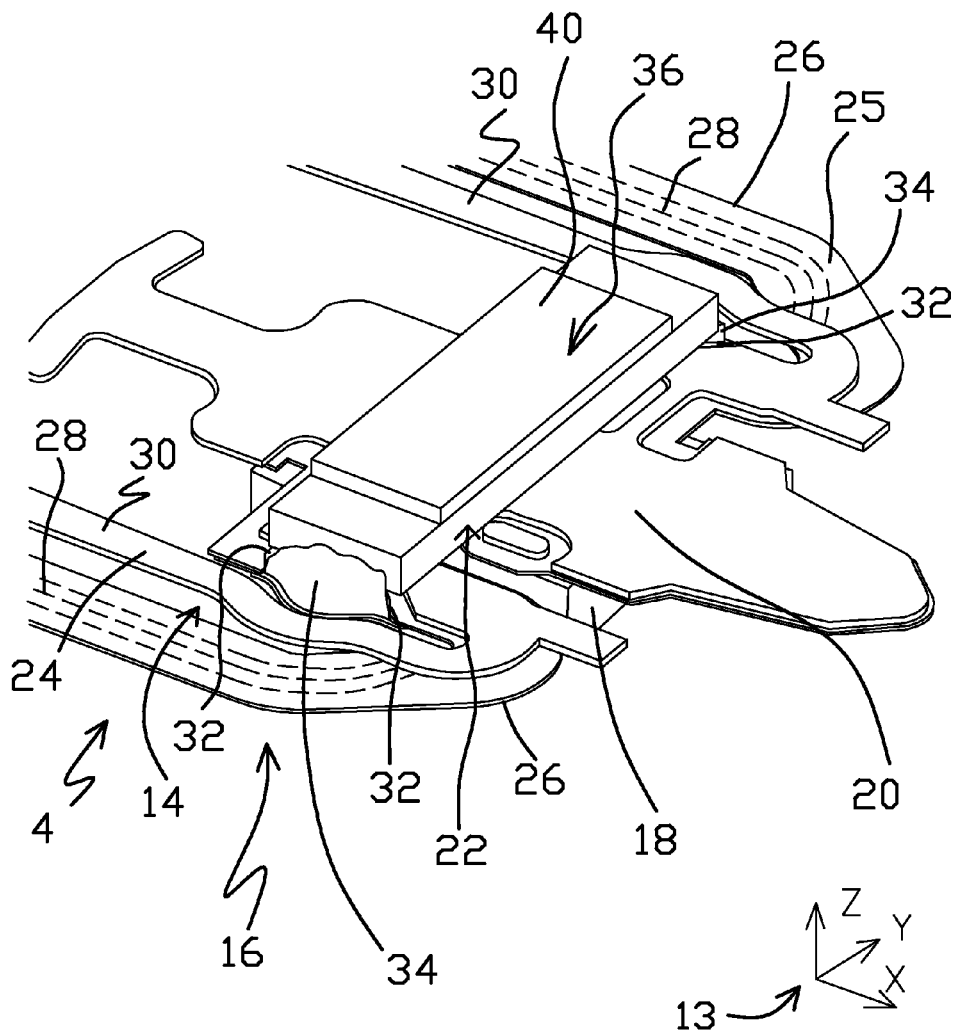
FIG. 3 is a perspective view of the stainless steel side of the distal end of a flexure with parts of the suspension removed from view to highlight the DSA structure having a motor.

FIG. 3 is a perspective view of the stainless steel side of the distal end of a flexure 4 with parts of the suspension 2 removed from view to highlight the DSA structure 16. The DSA structure 16 includes the motor 22 mounted to the gimbal 14 of the flexure 4 between the loadbeam 8 (not shown in FIG. 3) and the head slider 18. As described in greater detail below, in response to electrical differential signals applied to the motor 22, the motor 22 drives portions of the gimbal 14, including the tongue 20 and slider 18, about a generally transverse tracking axis.

The connectors 34 attach the motor 22 to the flexure 4. Specifically, the pair of connectors 34 connect the lateral ends of the motor 22 to terminal pads 32 respectively located on the pair of spring arms 30. Lateral, as used herein, refers to the left and/or right directions orthogonal to the longitudinal axis of the suspension 2. The terminal pads 32 can be formed from metal (e.g., copper) and are exposed though the dielectric layer 25 of the flexure 4 to provide access for connectors 34 to make electrical connections with the traces 28. The connectors 34 can connect with respective anode and cathode terminals of the motor 22. Connectors 34 also mechanically support the motor 22 on the flexure 4. The connectors 34 can comprise solder, conductive epoxy (e.g., silver filled), or other material for forming an electrode connection.

The motor 22 includes a first major broad side 36 which, in this embodiment, represents a top side of the motor 22 facing away from the flexure 4. The motor 22 includes a stiffener 40 defining part of the first major broad side 36. The stiffener 40 can alternatively be located on the bottom side of the motor 22, facing toward the flexure 4. The stiffener 40 is a metal element. The stiffener 40 can be deposited on the motor 22 by being plated directly onto another layer of the motor 22. The structure, function, and other aspects of the stiffener 40 are further discussed herein.

In FIG. 3, the motor 22 is in a neutral, undriven state in which no tracking differential signal is applied to the motor 22. It is noted that each of the motor 22 and stiffener 40 in FIG. 3 have respective planar profiles that are parallel with the X-Y plane. While the thickness of the motor 22 is measured along the Z axis, the profile of the motor 22 is essentially entirely along the X-Y plane when in the neutral, undriven state. Rotation of the tongue 20 by actuation of the motor 22 rotates the slider mounting, and thereby the slider 18, about a tracking axis, as demonstrated in FIGS. 4 and 5 and further discussed herein.

Figure 4:
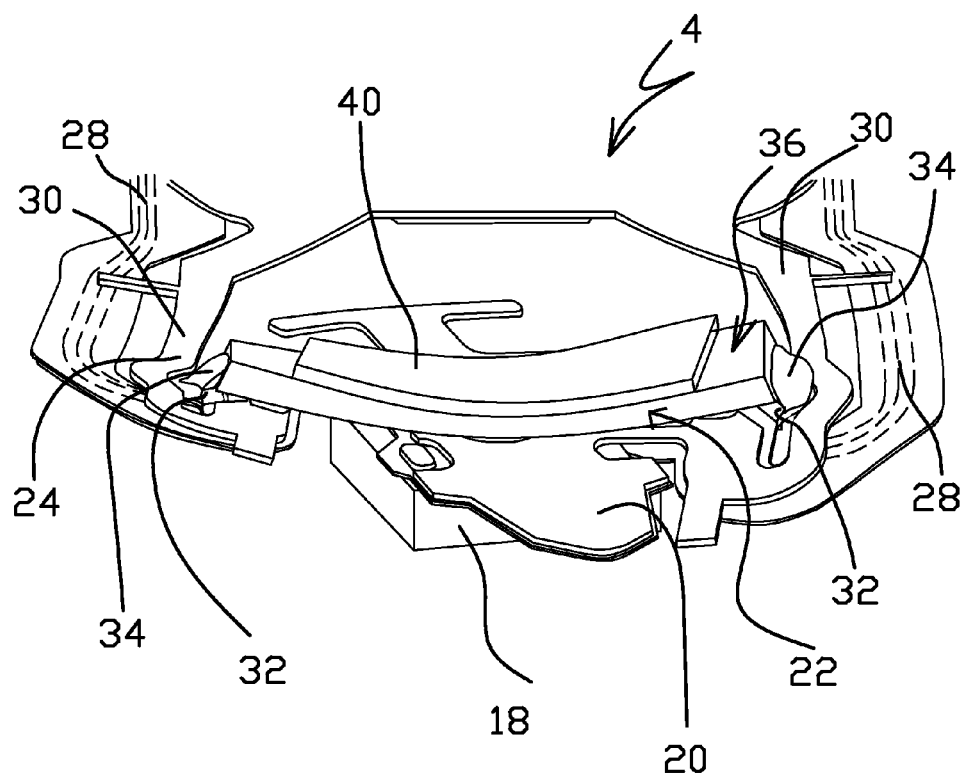
FIG. 4 shows the same view of FIG. 3 but with the motor articulating the DSA structure in a first direction.

FIG. 4 is a perspective view of the flexure 4 when the motor 22 is electrically activated to expand. In FIG. 4, a first differential signal is applied across the motor 22 via the traces 28 and connectors 34. The first differential signal (e.g., having a first polarity) causes the shape of the motor 22 to change. More specifically, the length of the motor 22 generally expands. The expansion of the motor 22 mechanically causes the tongue 20, and the slider 18 mounted thereon, to deflect in a first direction about an axis of rotation. The axis of rotation is generally parallel with the Z axis. As shown, the motor 22 exhibits some out-of-plane motion along the Z axis upon the application of the first differential signal. More specifically, the motor 22 curls away from the flexure 4 when the motor 22 expands such that the lateral ends of the motor 22 move away from the slider 18 and the stainless steel layer 24 relative to the middle of the motor 22. The curling motion of the motor 22 means that the motor 22 is bending out of an X-Y plane with which the motor 22 is flat when the motor 22 is undriven (e.g., in FIG. 3). The curling profile is achieved, at least in part, by the stiffener 40 as further discussed herein.

Figure 5:
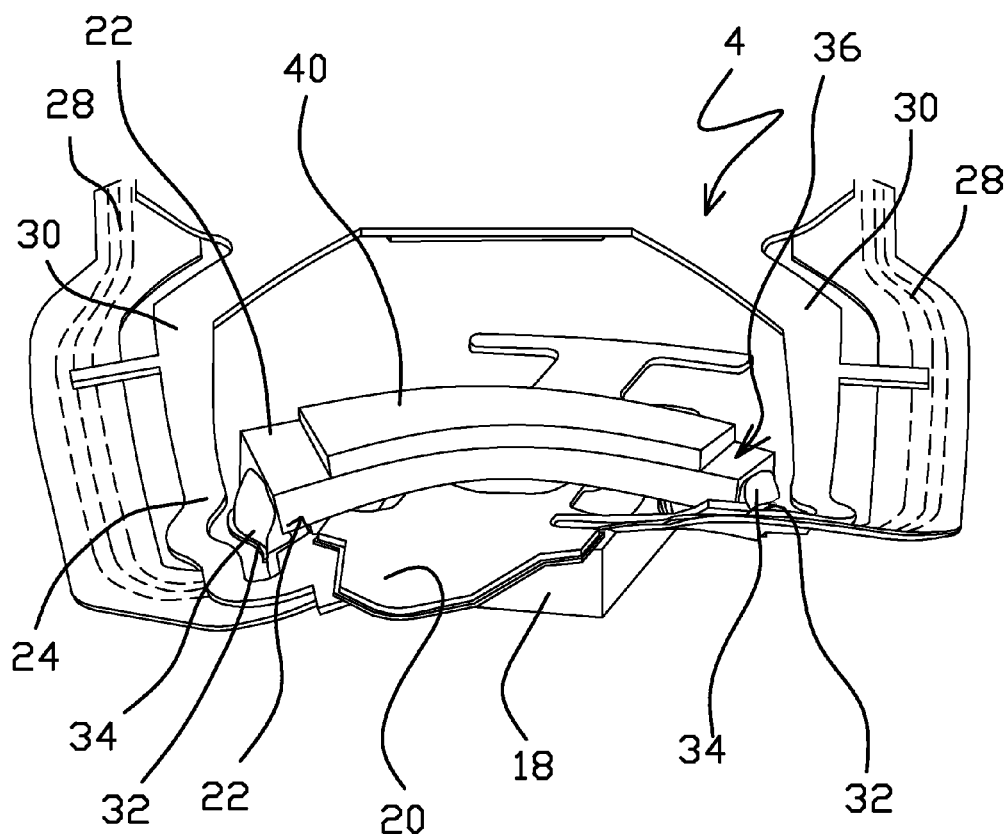
FIG. 5 shows the same view of FIGS. 3 and 4 but with the motor articulating the DSA structure in a second direction.

FIG. 5 is the same perspective view of the flexure 4 as FIG. 4 except that in FIG. 5 the motor 22 is electrically activated to generally contract. The contraction is caused by application of a second differential signal (e.g., having a second polarity opposite the first polarity) across the motor 22 via the traces 28 and connectors 34. The contraction of the motor 22 mechanically causes the tongue 20, and the slider 18 mounted thereon, to deflect in a second direction about the axis of rotation, the second direction opposite the first direction. As shown, the motor 22 exhibits some out-of-plane motion along the Z axis upon the application of the second differential signal. More specifically, the motor 22 curls toward the flexure 4 during contraction such that the lateral ends of the motor 22 move toward the slider 18 and the stainless steel layer 24 relative to the middle of the motor 22 which moves away from the slider 18 and the stainless steel layer 24. The curling of the motor 22 causes the flexure 4 to curl in the same manner. This curling of the flexure 4 can be advantageous because the curling causes more total motion in the flexure 4. Such motion can be converted into rotation of the slider 18, which provides greater total stroke for articulation of the DSA structure 16. Out-of-plane Z-axis motion (curling) and in plane X or Y motion (stretching/contracting) of the motor 22 can both be used to move the flexure 4 and rotate the slider 18. There are various motor configurations that can support the curling profiles of FIGS. 4 and 5, as further discussed herein.

Figure 6:
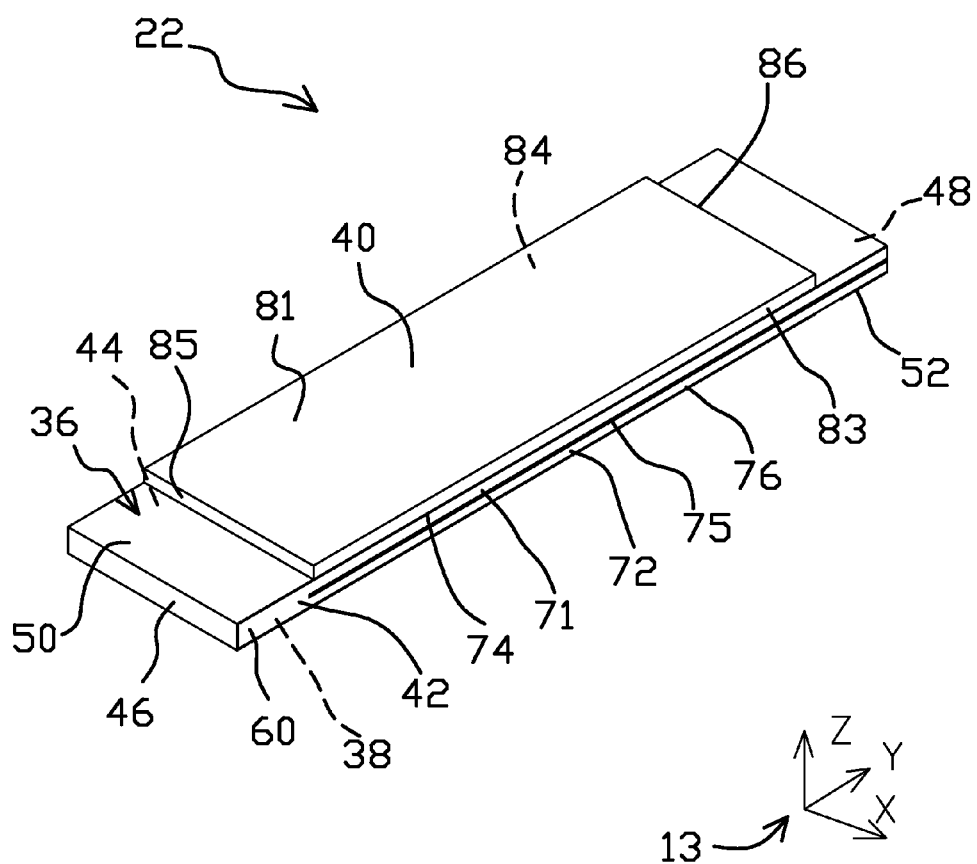
FIG. 6 is a detailed view of the motor of FIG. 3.
Figure 7:
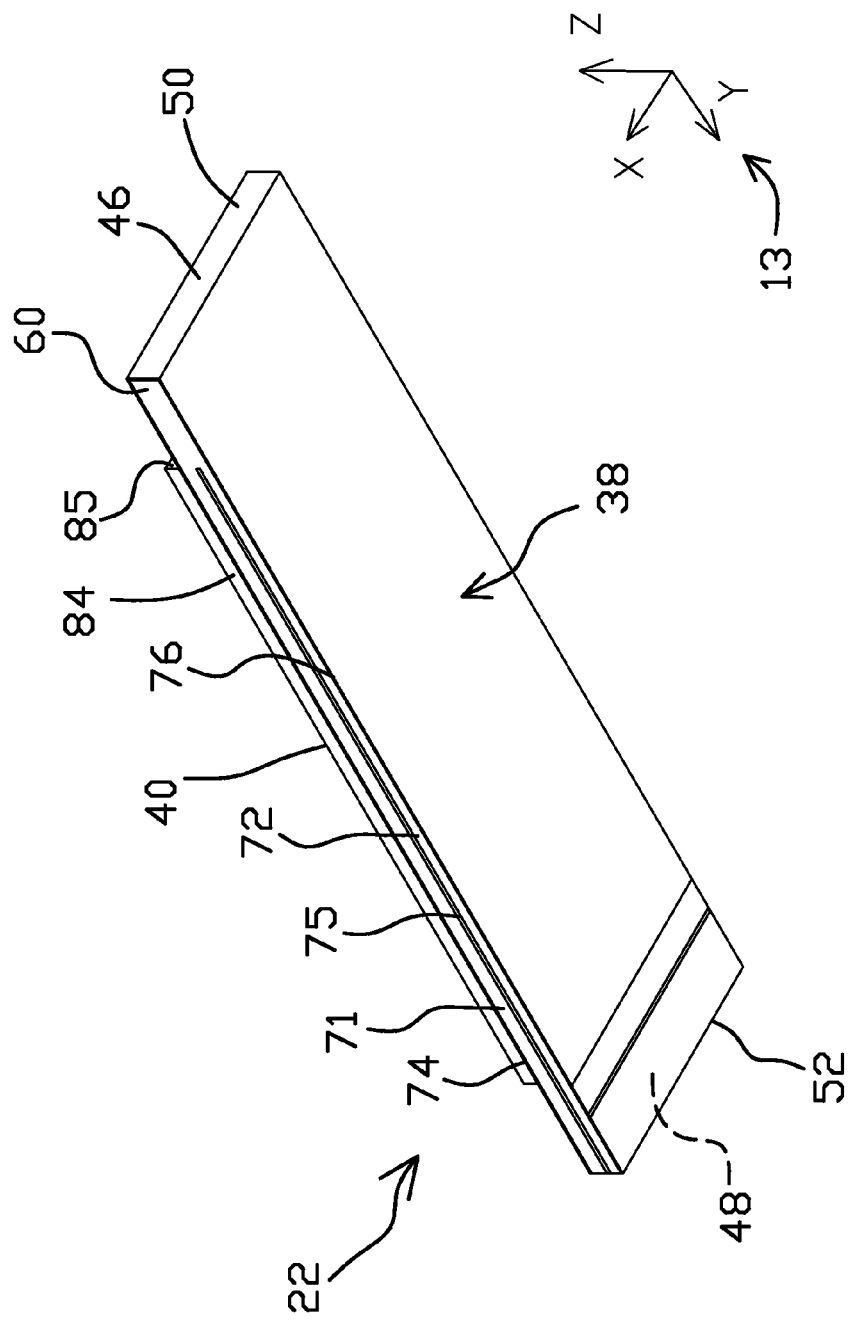
FIG. 7 is another detailed view of the motor of FIG. 3 but from a different perspective than the view of FIG. 6.
Figure 8:
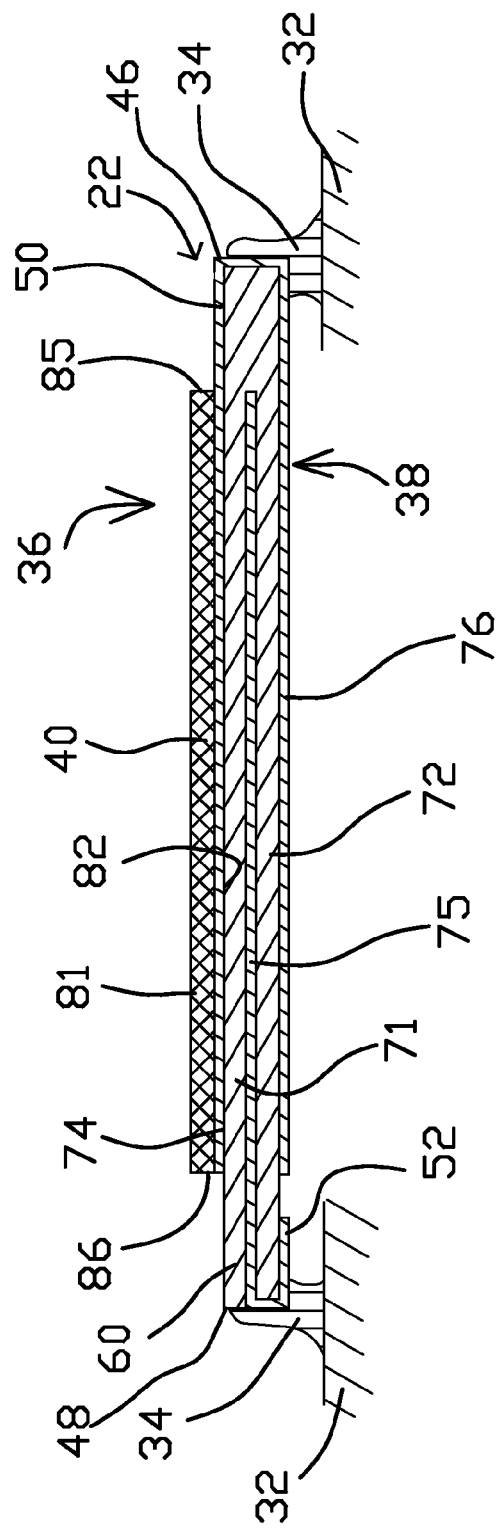
FIG. 8 is a cross sectional view of the motor of FIG. 3.

FIG. 6 is a detailed perspective view of the motor 22. A first major broad side 36 of the motor 22 is shown in FIG. 6. FIG. 7 is a detailed perspective view of the motor 22 showing the second major broad side 38 of the motor 22, the second major broad side 38 opposite the first major broad side 36. FIG. 8 is a cross-sectional view of the motor 22 which further shows connectors 34 and terminal pads 32.

Referring to FIGS. 6-8, the motor 22 generally includes a first long side 42, a second long side 44 opposite the first long side 42, a first end side 46, and a second end side 48 opposite the first end side 46. Each of the first and second long sides 42, 44 of the motor 22 can represent the length (measured along the y axis) of the motor 22 which is generally the longest dimension of the motor 22. For example, the first and second long sides 42, 44 are longer than the first and second end sides 46, 48. The motor 22 includes a first terminal 50 and a second terminal 52. The first and second terminals 50, 52 can be formed from gold, copper, and/or other highly conductive material. The first terminal 50 can extend along a majority of the first major broad side 36. The first terminal 50 can extend along some or all of the first end side 46. The first terminal 50 can extend along a majority of the second major broad side 38. The second terminal 52 can extend along at least part of the second major broad side 38. The second terminal 52 can extend along at least part of the second end side 48. The first terminal 50 can be electrically connected to one side of a circuit of the flexure 4 while the second terminal 52 can be connected to the other side of the circuit, such that an electric potential can be applied across the motor 22, causing current to flow through the motor 22. It will be understood that the first terminal 50 and the second terminal 52 can reversibly serve as either anode or cathode.

The motor 22 is comprised of multiple layers. The motor 22 includes piezoelectric material 60. The piezoelectric material 60 can comprise lead titanate or various other materials that exhibit piezoelectric movement when subjected to an electric potential. The piezoelectric material 60 is divided into a plurality of actuator layers. The plurality of actuator layers includes a first actuator layer 71 and a second actuator layer 72. The plurality of piezoelectric layers are in a stacked arrangement. For example, the first actuator layer 71 is adjacent to the second actuator layer 72. In some embodiments, the motor 22 can be limited to the first and second actuator layers 71, 72 and may not include any more actuator layers formed from piezoelectric material 60. Various other embodiments can include only one actuator layer or more than two actuator layers, such as three, four, five, or more actuator layers.

The motor 22 further comprises a plurality of conductive layers. The plurality of conductive layers can be formed from conductive metal, such as gold or copper. The plurality of conductive layers includes a first conductive layer 74. The first conductive layer 74 defines part of the first major broad side 36 of the motor 22. The first conductive layer 74 forms part of the first terminal 50 of the motor 22. The plurality of conductive layers further comprises a second conductive layer 75. The second conductive layer 75 is sandwiched between the first and second actuator layers 71, 72. The second conductive layer 75 can form part or all of the second terminal 52. The second conductive layer 75 can define part of the second end side 48. The plurality of conductive layers further comprises a third conductive layer 76. As shown, the first conductive layer 74 can be continuous with the third conductive layer 76. The third conductive layer 76 defines part of the second major broad side 38 of the motor 22. It is noted that the first and third conductive layers 74, 76 can serve as top and bottom conductive layers, respectively. The plurality of conductive layers can be sputtered on the piezoelectric material 60.

The stiffener 40 includes a top side 81 and a bottom side 82 opposite the top side 81. The top side 81 can form a plane that is parallel with the X-Y plane. As such, part of, or the whole of, the top side 81 can be flat, or substantially flat. The top side 81 can extend across and define some, a majority, or all of the first major broad side 36 of the motor 22. The bottom side 82 of the stiffener 40 can be coextensive with the topside 81.

In the embodiment of FIGS. 6-8, the topside 81 of the stiffener 40 is free from contact with any other elements of the suspension 2. The bottom side 82 of the stiffener 40 is in contact with the top side of the first conductive layer 74. The bottom side of the first conductive layer 74 is in contact with the top side of the first actuator layer 71. The bottom side of the first actuator layer 71 is in contact with the top side of the second conductive layer 75. The bottom side of the second conductive layer 75 is in contact with the top side of the second actuator layer 72. The bottom side of the second actuator layer 72 is in contact with the top side of the third conductive layer 76. The bottom side of the third conductive layer 76 is, in part, exposed on the second major broad side 38 of the motor 22. It is noted that the stiffener 40, or other stiffener referenced herein, can be disposed on the bottom side of the third conductive layer 76 (or other bottom conductive layer) instead of, or in addition to, being disposed on the top side of the motor 22. As shown in FIG. 8, the connectors 34 can contact and attach to the second major broad side 38 as well as the first and second end sides 46, 48 of the motor 22.

Each of the first and second long sides 83, 84 of the stiffener 40 can represent the length (measured along the y axis) of the stiffener 40 which is generally the longest dimension of the stiffener 40 and can extend the full length of the stiffener 40. Each of the first and second long sides 83, 84 can be orientated orthogonal to the topside 81 and the bottom side 82. Each of the first and second long sides 83, 84 can form respective planes that are parallel with each other and the Y-Z plane. The stiffener 40 includes a first end side 85 and a second end side 86 opposite the first end side 85. Each of the first and second end sides 85, 86 can represent the width (measured along the x axis) of the stiffener 40 and can extend the full width of the stiffener 40. The width of the stiffener 40 is generally shorter than the length of the stiffener 40. Each of the first and second end sides 85, 86 can be orientated orthogonal to the topside 81, the bottom side 82, the first long side 83, and the second long side 84. Each of the first and second end sides 85, 86 can form respective planes that are parallel with each other and the X-Z plane. In the embodiment of FIGS. 6-8, one, some, or all of the topside 81, the first long side 83, the second long side 84, the first end side 85, and the second end side 86 of the stiffener 40 is free from contact with any other elements of the suspension 2. As such, each of the topside 81, the first long side 83, the second long side 84, the first end side 85, and the second end side 86 of the stiffener 40 can be fully exposed.

The width (along the X axis) of the stiffener 40 in FIGS. 6-8 is equal to the width of the motor 22 as a whole. Therefore, the first long side 83 can be aligned (e.g., flush) with the first long side 42 of the motor 22 and the second long side 84 can be aligned with the second long side 44 of the motor 22. In some other embodiments, the width and/or length of the stiffener 40 can be less than the width or length of the rest of the motor 22 (e.g., less than the width or length of the conductive layers and activator layers of the piezoelectric material 60).

As shown in FIGS. 6-8, the stiffener 40 can be raised from the rest of the motor 22. For example, the stiffener 40 is raised on the first major broad side 36 relative to the piezoelectric material 60 and the first conductive layer 74. The thickness of the stiffener 40 can be measured (e.g., along the z axis) as the distance from the top side 81 to the bottom side 82 or the first conductive layer 74. The thickness of the stiffener 40 can correspond to the width of any of the first long side 83, the second side 84, the first end side 85, and the second end side 86. The thickness of the stiffener 40 can be 25 micrometers, for example. In some embodiments, the thickness of the stiffener 40 is equal to the thickness (e.g., measured along the z axis) of the first and second actuator layers 71, 72, respectively.

In some embodiments, the motor 22 can be understood to have a stiffener portion composed of the stiffener 40 and not include any piezoelectric material 60. The motor 22 can further be understood to have an actuator portion composed of the piezoelectric material 60 and the plurality of conductive layers (e.g., first, second, and third conductive layers 74-76). The actuator portion may not include any of the stiffener 40 or, alternatively, any of the same metal used to form the stiffener 40. The stiffener portion can be mounted on the actuator portion. The stiffener portion can be wholly above, or alternatively wholly below, the actuator portion. The first long side 83, the second long side 84, the first end side 85, and the second end side 86 can represent the sides of the stiffener portion while the first long side 42, the second long side 44, the first end side 46, and the second end side 48 can represent the sides of the activator portion. As shown, the first long side 83 extends parallel with the first long side 42, the second long side 84 extends parallel with the second long side 44, the first end side 85 extends parallel with the first end side 46, and the second end side 86 extends parallel with the second end side 48.

The stiffener 40 can be formed by being plated directly onto the first conductive layer 74, such as by vapor deposition, sputter deposition, and/or as a liquid plating solution. The first conductive layer 74 and the stiffener 40 can be formed from different types of metals. For example, the first conductive layer 74 can be formed from copper or gold. Copper and gold can be preferred for the first conductive layer 74 and other conductive layers because of the highly conductive properties of these metals. The stiffener 40 is not used as an electrical conductor, and indeed no current may flow through the stiffener 40 in same cases because the stiffener 40 is not connected to any other parts except for the first conductive layer 74 and such that stiffener 40 does not electrically bridge between different conductive elements. As such, less conductive material may be used to form the stiffener 40 relative to the metal used to form the first conductive layer 74. The stiffener 40 may be formed from a metal that is stiffer (having a higher elastic modulus) than the first conductive layer 74. In some embodiments, the stiffener 40 is formed from pure nickel. Being that the stiffener 40 can be plated directly onto the top side of the first conductive layer 74, the stiffener 40 is bonded to the first conductive layer 74 and thereby attached to the rest of the motor 22. Furthermore, being that the stiffener 40 is plated on the top side of the first conductive layer 74, there may not be any other material between the stiffener 40 and the first conductive layer 74 such as an adhesive (e.g., no epoxy or polymer) or other material. While the stiffener 40 is shown as disposed on the top side of the first conductive layer 74, the stiffener 40 may additionally or alternatively be disposed on the first actuator layer 71 or the stiffener 40 may additionally or alternatively be disposed on another metal layer (not illustrated) of the motor 22.

Each of the first and second conductive layers 74, 75 can be thinner than the stiffener 40. For example, each of the first and second conductive layers 74, 75 can be about five, ten, or more times thinner than the stiffener 40. Each of the first and second conductive layers 74, 75 can be equal in thickness to each other. In some configurations, each of the first and second conductive layers 74, 75 does not materially contribute to the stiffness of the motor 22. Therefore, the mechanics of the motor 22, such as the bending profile of the motor 22, can be based on the piezoelectric material 60 and the stiffener 40 but not on the first and second conductive layers 74, 75.

A differential signal applied across the first and second terminals 50, 52 causes current to flow through the piezoelectric material 60. The first and second actuator layers 71, 72 are electrically in parallel between the first and second terminals 50, 52 such that, in some configurations, approximately equal electric potentials will be developed across the first and second actuator layers 71, 72 and approximately equal levels of current will flow through the first and second actuator layers 71, 72. The flow of current through the piezoelectric material 60 causes the first and second actuator layers 71, 72 to expand and/or contract. For example, both of the first and second actuator layers 71, 72 can be poled so as to expand or contract together, or alternatively can be poled such that one of the actuator layers expands while the other contacts in response to the differential signal.

Figure 9:
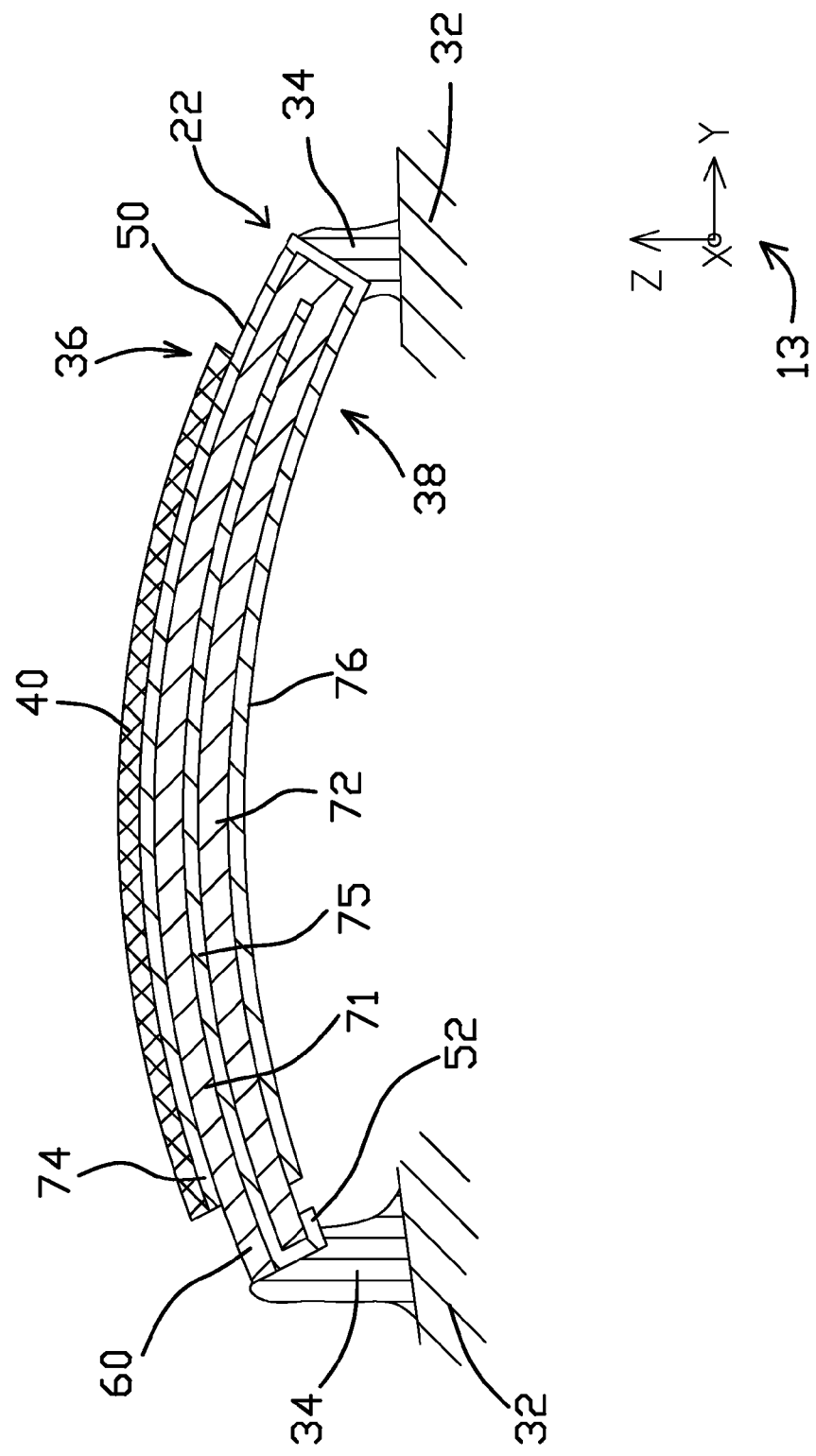
FIG. 9 shows the same cross sectional view of FIG. 8 but while the motor is activated to generally expand laterally.

FIG. 9 is the same cross-sectional view as shown in FIG. 8, but during electrical activation of the motor 22. As shown in FIG. 9, the motor 22 generally contracts upon activation. During this activation, one or both of the first and second actuator layers, 71, 72 are activated to contract laterally (i.e. along the y-axis). In some embodiments, both of the first and second actuator layers 71, 72 contract while in some other embodiments only one actuator layer contracts. The stiffener 40 does not have piezoelectric properties, and therefore may not expand or contract upon electrical activation of the piezoelectric material 60. The length of the stiffener 40 (e.g., measured along the y-axis) does not change upon activation of the motor 22 and therefore the stiffener 40 resists the shortening of the motor 22. The general lateral contraction of the piezoelectric material 60 and the consistent length of the stiffener 40 causes a disparity of motion within the layers of the motor 22. The layers of the motor 22 are held together such that the motor 22 bends out of the X-Y plane, specifically along the z axis, to accommodate the disparity in motion. Being that the stiffener 40 is on the first major broad side 36 of the motor 22 (e.g., on the topside), this side of the motor 22 is more resistant to contraction relative to the second major broad side 38 of the motor 22 (e.g., the bottom side). Therefore, the contracting motor 22 curls away from the first major broad side 36 and the stiffener 40, and curls toward and around second major broad side 38. The motion shown in FIG. 9 can correspond to the motion shown in FIG. 5

Figure 10:
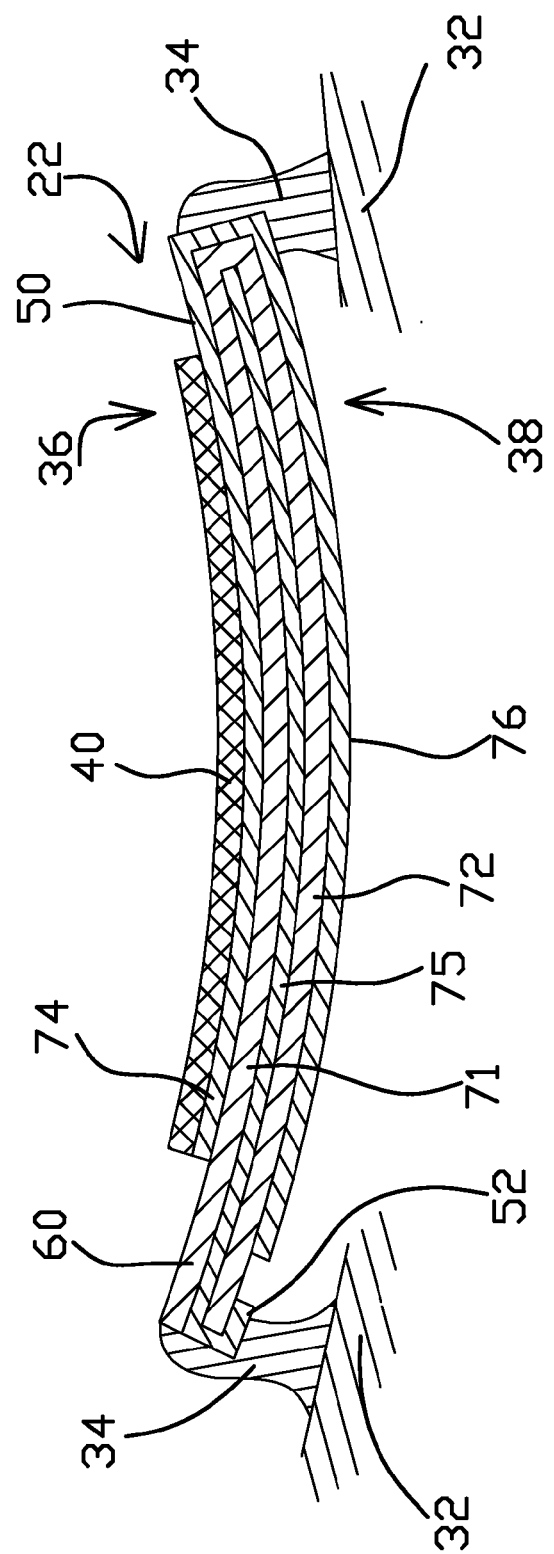
FIG. 10 shows the same cross sectional view of FIG. 8 but while the motor is activated to generally contract laterally.

FIG. 10 is the same cross-sectional view as shown in FIG. 9, but during electrical activation of the motor 22 which causes a general lengthening of the motor 22. During this activation, one or both of the first and second actuator layers, 71, 72 are activated to expand laterally (i.e. along the y-axis). In some embodiments, both of the first and second actuator layers 71, 72 expand while in some other embodiments only one actuator layer expands. The stiffener 40 does not have piezoelectric properties, and therefore may not expand or contract upon electrical activation of the piezoelectric material 60. The length of the stiffener 40 (e.g., measured along the y-axis) does not change upon activation of the motor 22 and therefore the stiffener 40 resists the lengthening of the motor 22. The general lateral lengthening of the piezoelectric material 60 and the consistent length of the stiffener 40 causes a disparity of motion within the layers of the motor 22. The layers of the motor 22 are held together such that the motor 22 bends out of the X-Y plane, specifically along the z axis, to accommodate the disparity in motion. Being that the stiffener 40 is on the first major broad side 36 of the motor 22 (e.g., on the topside), this side of the motor 22 is more resistant to expansion relative to the second major broad side 38 of the motor 22 (e.g., the bottom side). Therefore, the lengthening motor 22 curls toward and around the first major broad side 36 and the stiffener 40, and curls away from the second major broad side 38. The motion shown in FIG. 10 can correspond to the motion shown in FIG. 4.

In performance testing conducted by the inventors, a motor having a plated stiffener similar to that shown in FIGS. 3-6 exhibited superior stoke performance relative to a standard five layer motor that did not include a plated stiffener. More specifically, the motor having the plated stiffener was tested to have a 25.1 nanometer/volt stroke while the standard five layer motor was tested to have a 13.6 nanometer/volt stroke.

Figure 11:
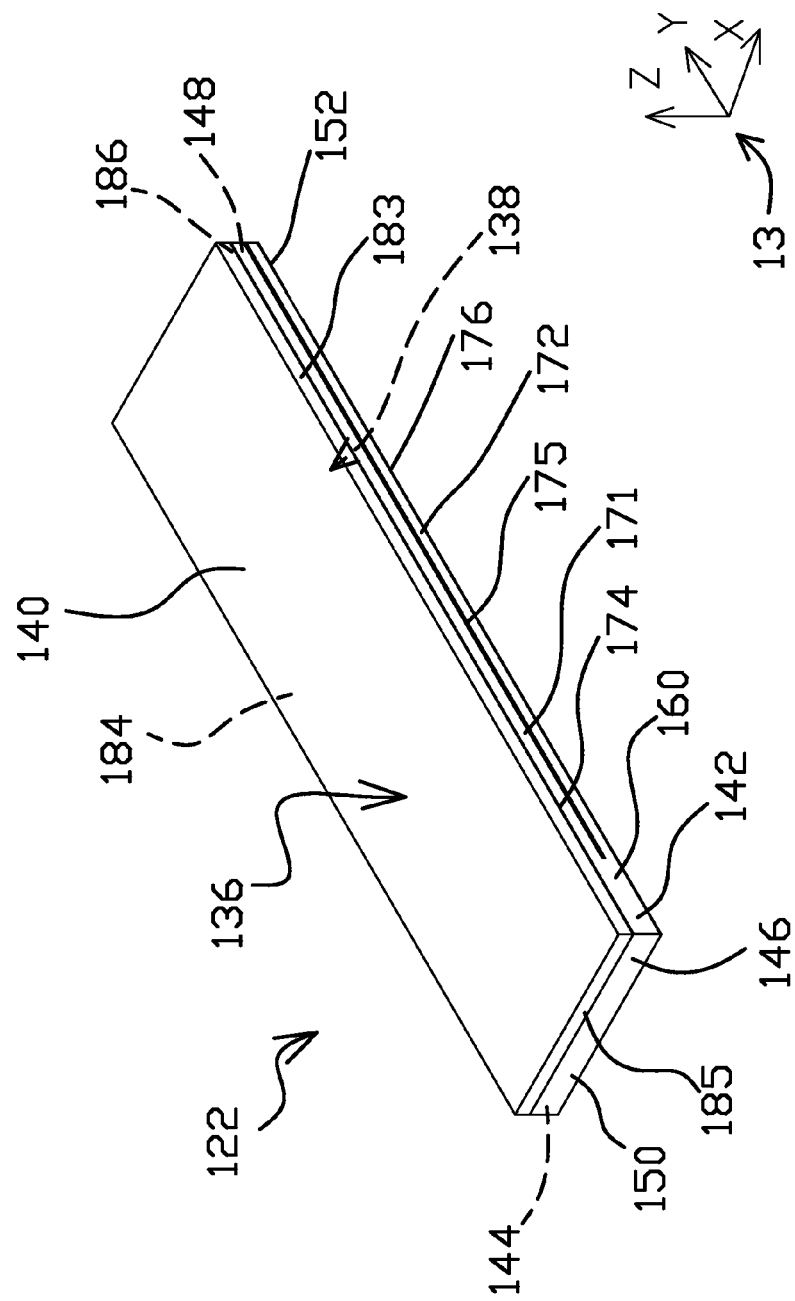
FIG. 11 is a detailed view of a motor having a stiffener.

FIG. 11 is a detailed perspective view of a motor 122 having an alternative configuration to the embodiments previously discussed. The motor 122 can be mounted on various flexures, such as that shown in FIGS. 1-5 or any other flexure referenced herein. The motor 122 can be structurally and functionally identical to any motor referenced herein, including motor 22, except where stated or shown to be different. The motor 122 generally includes first long side 142, a second long side 144 opposite the first long side 142, a first end side 146, and a second end side 148 opposite the first end side 146. The motor 122 includes a first terminal 150 and a second terminal 152. The motor 122 includes a piezoelectric material 160. The piezoelectric material 160 includes first and second actuator layers 171, 172. The motor 122 further comprises a first, second, and third conductive layers 174-176. The first conductive layer 174 defines part of the first major broad side 136 of the motor 122 while the third conductive layer 176 defines part of the second major broad side 138 of the motor 122 opposite the first major broad side 136.

The motor 122 comprises a stiffener 140. The stiffener 140 can be structurally and functionally identical to any stiffener referenced herein, including stiffener 40, except were stated or shown to be different. The stiffener 140 includes a first long side 183, a second long side 184 opposite the first long side 83, a first end side 185, and a second end side 186 opposite the first end side 185.

The stiffener 140 forms the whole top of the motor 122, or more specifically, defines the entirety of the first major broad side 136. For example, a first long side 183 of the stiffener 40 extends at least to the first long side 142 of the motor 122. For example, the first long side 183 of the stiffener 140 can be aligned (e.g., flush) with the first long side 142 of the motor 122. A second long side 184 of the stiffener 140 extends at least to the second long side 144 of the motor 122. For example, the second long side 184 of the stiffener 140 can be aligned (e.g., flush) with the second long side 144 of the motor 122. A first end side 185 of the stiffener 140 extends at least to the first end side 146 of the motor 122. For example, the first end side 185 of the stiffener 140 can be aligned (e.g., flush) with the first end side 146 of the motor 122. A second end side 186 of the stiffener 140 extends at least to the second end side 148 of the motor 122. For example, the second end side 186 of the stiffener 140 can be aligned (e.g., flush) with the second end side 148 of the motor 122. The first conductive layer 174 can be coextensive with the stiffener 140.

Figure 12:
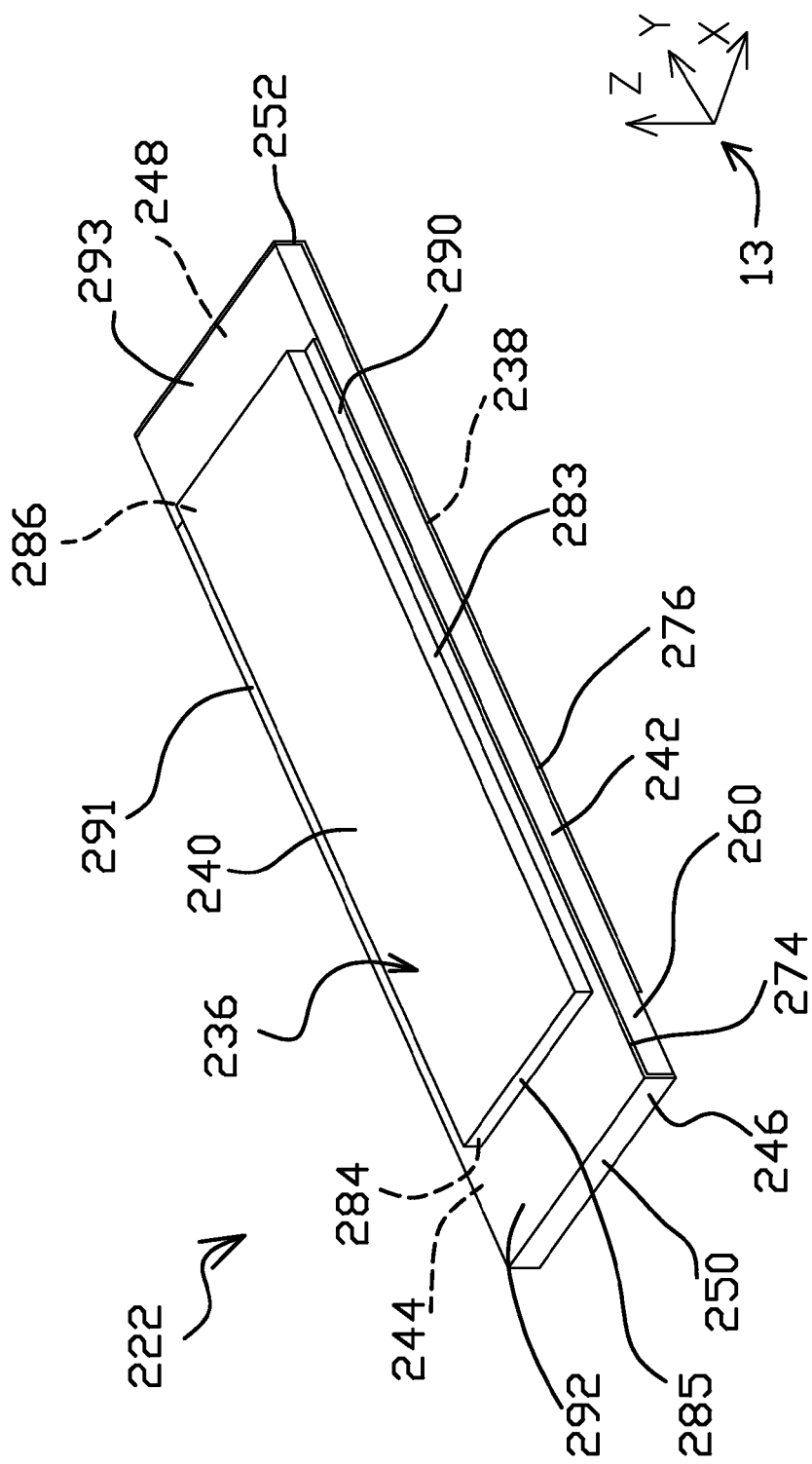
FIG. 12 is a detailed view of a motor having a stiffener.

FIG. 12 is a detailed perspective view of a motor 222 having an alternative configuration to the embodiments previously discussed. The motor 222 can be mounted on various flexures, such as that shown in FIGS. 1-5 or any other flexure referenced herein. The motor 222 can be structurally and functionally identical to any motor referenced herein, including motor 22, except where stated or shown to be different. The motor 222 generally includes first long side 242, a second long side 244 opposite the first long side 242, a first end side 246, and a second end side 248 opposite the first end side 246.

The motor 222 includes a first terminal 250 and a second terminal 252. The motor 222 further comprises a top conductive layer 274 and a bottom conductive layer 276. The top and bottom conductive layers 274, 276 can form the first and second terminals 250, 252, respectively. The top conductive layer 274 defines part of the first major broad side 236 of the motor 222 while the bottom conductive layer 276 defines part of the second major broad side 238 of the motor 222 opposite the first major broad side 236.

The motor 222 includes a piezoelectric material 260. The piezoelectric material 260 is located between the top and bottom conductive layers 274, 276. The piezoelectric material 260 is formed into a single layer. While motors with multiple layers of piezoelectric material are shown elsewhere herein, FIG. 12 demonstrates that the multiple layers of piezoelectric material in other embodiments can be replaced with a single layer of piezoelectric material, and thus any suspension, flexure, and/or stiffener can be used with a motor having only a single layer of piezoelectric material.

The motor 222 comprises a stiffener 240. The stiffener 240 can be structurally and functionally identical to any stiffener referenced herein, including stiffeners 40 and 140, except were stated or shown to be different. The stiffener 240 includes a first long side 283, a second long side 284 opposite the first long side 283, a first end side 285, and a second end side 286 opposite the first end side 285.

The stiffener 240 forms part of the top of the motor 222. Each of the sides 283-286 of the stiffener 240 are recessed from the sides 242, 244, 246, 248 of the rest of the motor 222, respectively. For example, a first long side 283 of the stiffener 240 is recessed from the first long side 242 of the motor 222 to form a first shelf 290. The second long side 284 of the stiffener 240 is recessed from the second long side 244 of the motor 222 to form a second shelf 291. The first end side 285 of the stiffener 240 is recessed from the first end side 246 of the motor 222 to form third shelf 292. The second end side 286 of the stiffener 240 is recessed from the second end side 248 of the motor 222 to form fourth shelf 293.

It is noted that similar names and/or reference numbers for elements used herein can imply that the elements can be similarly constructed. For the sake of brevity, various aspects of construction, such as material types and construction process steps, are not repeated for each embodiment. It will be understood, however, that the teachings provided herein in connection with any embodiment can be applied to any other embodiment.

Although the present invention has been described with reference to preferred embodiments, those skilled in the art will recognize that changes can be made in form and detail without departing from the spirit and scope of the invention. For example, although described in connection with certain co-located DSA structures, motors and associated features described herein can be used in connection with other DSA structures, including other co-located DSA structures and/or non-co-located DSA structures, with as with baseplate 6 or loadbeam 8 mounted motors. While various combinations of stiffeners and types of actuator portions of motors are presented herein, it will be understood that any stiffener referenced herein can be connected to any type of actuator portion of the motors referenced herein. Furthermore, the stiffener aspects disclosed herein can be used with virtually any type of DSA motor. As such, the present disclosure is not limited to the particular embodiments presented herein.

The following is claimed:

1. A suspension structure, comprising:
a gimbaled flexure; and
a motor mounted on a gimbaled portion of the flexure, the motor having a first major broad side and a second major broad side opposite the first major broad side, the motor comprising at least one layer of piezoelectric material located between the first and second major broad sides, and a metal stiffener layer plated onto and in contact with the first major broad side.

2. The suspension structure of claim 1, wherein the stiffener layer defines a majority of the first major broad side.

3. The suspension structure of claim 1, wherein the motor further comprises a first long side, a second long side opposite the first long side, a first end side, and a second end side opposite the first end side.

4. The suspension structure of claim 3, wherein the stiffener layer is formed from a first type of metal, and the first type of metal is only located along the first major broad side of the motor and is not located along any of the second major broad side, the first long side, the second long side, the first end side, or the second end side.

5. The suspension structure of claim 3, wherein a width of the stiffener layer extends from the first long side to the second long side.

6. The suspension structure of claim 1, wherein the stiffener layer is formed from a first type of metal, the motor comprises a conductive layer, the conductive layer defines a portion of the first major broad side, the conductive layer is formed from a second type of metal, and the metal stiffener layer is plated directly on the conductive layer along the first major broad side.

7. The suspension structure of claim 6, wherein the first type of metal is different than the second type of metal.

8. The suspension structure of claim 7, wherein the first type of metal comprises nickel.

9. The suspension structure of claim 8, wherein the second type of metal comprises gold.

10. The suspension structure of claim 6, wherein the second type of metal has a lower elastic modulus than the first type of metal.

11. The suspension structure of claim 10, wherein the first type of metal has a lower electrical conductivity than the second type of metal.

12. The suspension structure of claim 6, wherein the stiffener layer is thicker than the conductive layer.

13. The suspension structure of claim 6, wherein the stiffener layer is at least five times thicker than the conductive layer.

14. The suspension structure of claim 1, wherein the thickness of the stiffener layer is approximately equal to the thickness of any one of the at least one layer of piezoelectric material.

15. The suspension structure of claim 1, wherein the stiffener layer is raised relative to all other parts of the motor that form the first major broad side.

16. The suspension structure of claim 1, wherein the stiffener layer is only in contact with the motor and is free from contact with any other parts of the flexure.

17. The suspension structure of claim 1, wherein the motor is configured to at least partially curl while expanding or contracting upon application of an electrical signal to the motor.

18. A suspension structure, comprising:
a gimbaled flexure; and
a motor mounted on a gimbaled portion of the flexure, the motor comprising:
at least one layer of piezoelectric material;
a conductive layer, the conductive layer formed from a first type of metal; and
a metal stiffener layer plated on and in contact with the conductive layer, the stiffener layer formed from a second type of metal, wherein the first type of metal has a lower elastic modulus and a higher electrical conductivity than the second type of metal, and the stiffener layer is thicker than the conductive layer.

19. The suspension structure of claim 18, wherein, with respect to the motor, the second type of metal is disposed only on the conductive layer.

20. A suspension structure, comprising:
a gimbaled flexure; and
a motor mounted on a gimbaled portion of the flexure, the motor comprising:
at least one layer of piezoelectric material;
a conductive layer, the conductive layer formed from a first type of metal;
a metal stiffener layer plated on and in contact with the conductive layer, the stiffener layer formed from a second type of metal that is different than the first type of metal, wherein the second type of metal comprises nickel.

* * * * *